United States Patent
Shibata

(10) Patent No.: US 10,770,375 B2
(45) Date of Patent: Sep. 8, 2020

(54) SEMICONDUCTOR DEVICE

(71) Applicant: RENESAS ELECTRONICS CORPORATION, Tokyo (JP)

(72) Inventor: Jun Shibata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/247,054

(22) Filed: Jan. 14, 2019

(65) Prior Publication Data
US 2019/0259687 A1   Aug. 22, 2019

(30) Foreign Application Priority Data
Feb. 19, 2018  (JP) .................. 2018-027347

(51) Int. Cl.
*H01L 23/495* (2006.01)
*H01L 23/00* (2006.01)
(Continued)

(52) U.S. Cl.
CPC ...... *H01L 23/49503* (2013.01); *H01L 21/561* (2013.01); *H01L 21/78* (2013.01);
(Continued)

(58) Field of Classification Search
CPC ............. H01L 24/48; H01L 23/49541; H01L 23/49548; H01L 2224/8385; H01L 2224/48227; H01L 23/49503; H01L 23/49568; H01L 23/3107; H01L 23/49582; H01L 24/78; H01L 24/83; H01L 24/97; H01L 23/49513; H01L 2924/00014; H01L 21/565; H01L 2224/73265; H01L 2224/32245; H01L 23/4952; H01L 24/85;
(Continued)

(56) References Cited

U.S. PATENT DOCUMENTS 5,237,202 A   8/1993   Shimizu et al.
6,703,696 B2  3/2004   Ikenaga et al.
(Continued)

FOREIGN PATENT DOCUMENTS

JP   03-218658 A    9/1991
JP   2002-076228 A  3/2002
JP   2002-261187 A  9/2002

*Primary Examiner* — Jasmine J Clark
(74) *Attorney, Agent, or Firm* — McDermott Will & Emery LLP

(57) ABSTRACT

A semiconductor device according to one embodiment of the present invention includes a wire electrically connecting a die pad and a semiconductor chip mounted on the die pad to each other, and an encapsulation body encapsulating the semiconductor chip. The die pad includes a wire-bonding region to which the wire is connected and a through hole penetrating through the die pad in a thickness direction. The wire-bonding region is covered by a metal film partially covering the die pad. The through hole is formed at a position overlapping the metal film. The encapsulation body includes a first portion formed over the die pad, a second portion formed under the die pad, and a third portion buried in the through hole of the die pad, wherein the first portion and the second portion of the encapsulation body are connected with each other via the third portion.

20 Claims, 22 Drawing Sheets

(51) Int. Cl.
    *H01L 23/31*     (2006.01)
    *H01L 23/29*     (2006.01)
    *H01L 21/56*     (2006.01)
    *H01L 21/78*     (2006.01)

(52) U.S. Cl.
    CPC ........ *H01L 23/295* (2013.01); *H01L 23/3121* (2013.01); *H01L 23/49541* (2013.01); *H01L 23/49548* (2013.01); *H01L 23/49582* (2013.01); *H01L 24/05* (2013.01); *H01L 24/48* (2013.01); *H01L 24/92* (2013.01); *H01L 24/97* (2013.01); *H01L 23/4952* (2013.01); *H01L 23/49568* (2013.01); *H01L 24/73* (2013.01); *H01L 24/83* (2013.01); *H01L 24/85* (2013.01); *H01L 2224/04042* (2013.01); *H01L 2224/32245* (2013.01); *H01L 2224/48091* (2013.01); *H01L 2224/48106* (2013.01); *H01L 2224/48247* (2013.01); *H01L 2224/48639* (2013.01); *H01L 2224/48644* (2013.01); *H01L 2224/48839* (2013.01); *H01L 2224/48844* (2013.01); *H01L 2224/73265* (2013.01); *H01L 2224/8385* (2013.01); *H01L 2224/83801* (2013.01); *H01L 2224/85201* (2013.01); *H01L 2224/92247* (2013.01); *H01L 2924/35121* (2013.01)

(58) Field of Classification Search
    CPC ....... H01L 23/3121; H01L 2224/48844; H01L 2224/48247; H01L 2224/48257; H01L 24/05; H01L 21/78; H01L 24/73
    See application file for complete search history.

(56) References Cited

U.S. PATENT DOCUMENTS

| | | |
|---|---|---|
| 6,713,849 B2 | 3/2004 | Hasebe et al. |
| 2005/0242417 A1* | 11/2005 | Youn ................ H01L 23/49503 257/676 |
| 2005/0260795 A1* | 11/2005 | Park ................ H01L 23/49503 438/111 |

\* cited by examiner

SEMICONDUCTOR DEVICE

CROSS-REFERENCE TO RELATED APPLICATION

The present application claims priority from Japanese Patent Application No. 2018-027347 filed on Feb. 19, 2018, the content of which is hereby incorporated by reference into this application.

TECHNICAL FIELD OF THE INVENTION

The present invention relates to a semiconductor device and relates to a technique effectively applied to a semiconductor device having, for example, a semiconductor chip and a die pad on which the semiconductor chip is mounted that are electrically connected to each other via wires.

BACKGROUND OF THE INVENTION

Japanese Patent Application Laid-Open Publication No. H03-218658 (Patent Document 1) has disclosed a multilayer lead frame structure in which an inner lead and a metal plane are adhered to each other via an insulating layer and in which a through hole is formed in one or both of the sides sandwiching a wire-bonding region of the metal plane.

Japanese Patent Application Laid-Open Publication No. 2002-76228 (Patent Document 2) has disclosed a semiconductor device in which a semiconductor chip mounted on a die pad is electrically connected to the die pad via wires. In Patent Document 2, the die pad has a silver plated film formed over a portion to which the wires are connected.

Japanese Patent Application Laid-Open Publication No. 2002-261187 (Patent Document 3) has disclosed a semiconductor device in which a semiconductor chip mounted on a die pad is electrically connected to the die pad via wires. In Patent Document 3, the die pad has a plated film formed over a portion to which the wires are connected and a trench or a slit formed between the plated film and the semiconductor chip.

SUMMARY OF THE INVENTION

The inventor of the present invention has been developing a technique for improving performance of semiconductor devices. In this process, the inventor has studied a technique for suppressing damage to a connecting portion between wires and a die pad in a semiconductor device having a semiconductor chip mounted on the die pad that are electrically connected to the die pad via the wires, and has found that there is still room for improvement.

For example, one of the causes of damage to the connecting portion between the wires and the die pad is delamination of an adhesive interface between the die pad and an encapsulation body encapsulating the semiconductor chip. However, when measures to prevent delamination of the adhesive interface or to prevent progress of delamination were prioritized, it was found that other problems such as a decrease in heat dissipation efficiency occur.

Other problems and novel features will be apparent from the present specification and attached drawings.

A semiconductor device according to one embodiment of the present invention includes a wire electrically connecting a die pad and a semiconductor chip mounted on the die pad to each other, and an encapsulation body encapsulating the semiconductor chip. The die pad includes a wire-bonding region to which the wire is connected and a first through hole penetrating through the die pad in a thickness direction. The wire-bonding region is covered by a first metal film partially covering the die pad. The first through hole is formed at a position overlapping the first metal film or around the first metal film. The encapsulation body includes a first portion formed over the die pad, a second portion formed under the die pad, and a third portion buried in the first through hole of the die pad, wherein the first portion and the second portion of the encapsulation body are connected to each other via the third portion.

According to the above-described embodiment, performance of the semiconductor device can be improved.

DESCRIPTION OF THE PREFERRED EMBODIMENTS

Figure 1:
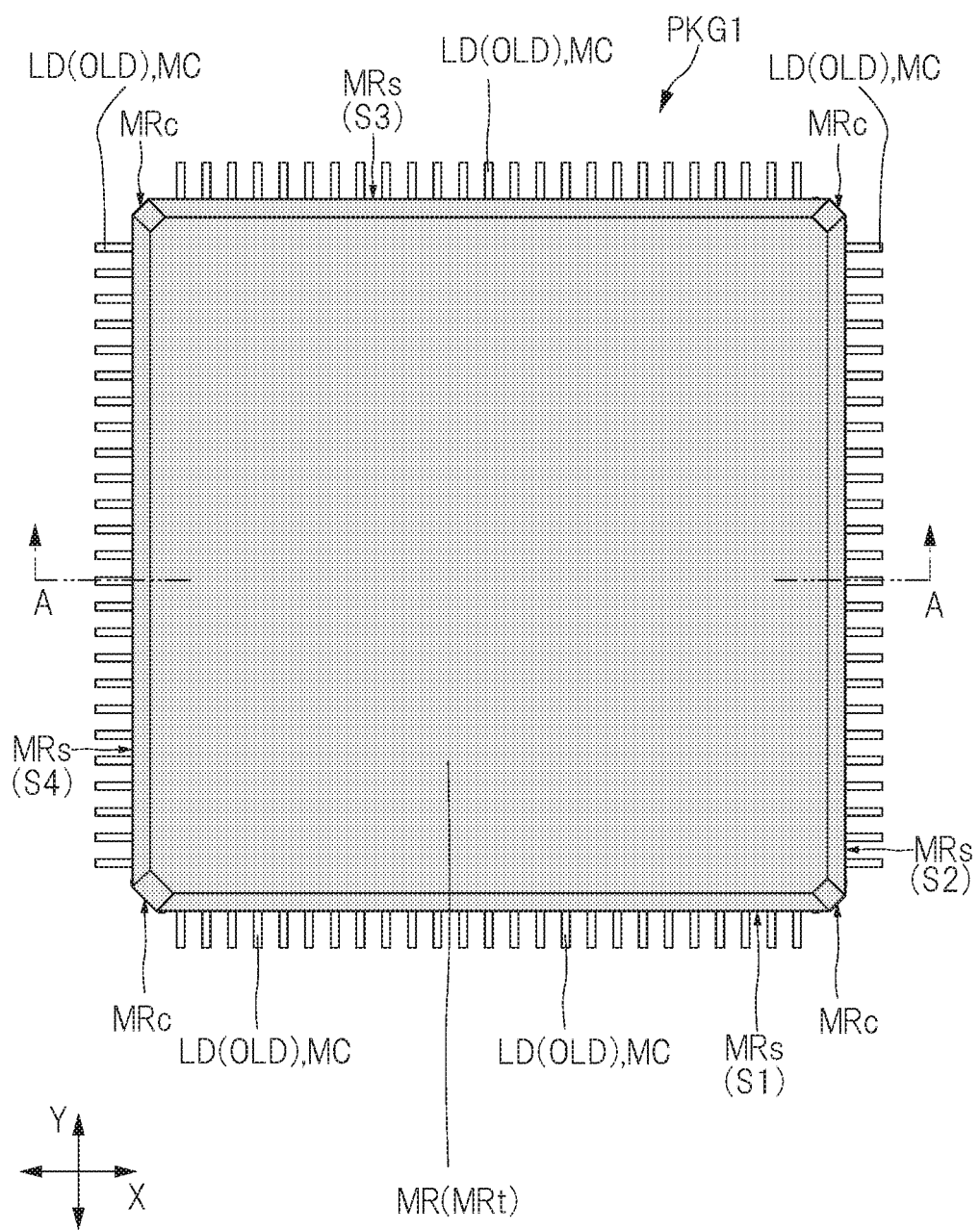
FIG. 1 is a top view of a semiconductor device according to one embodiment of the present invention.

Explanation of Description Format, Basic Terminology and Usage in Present Application In the present application, embodiments will be described in a plurality of sections or the like when necessary for the sake of convenience. However, these sections or the like are not independent or separate from each other unless otherwise clearly specified, and one portion of an example corresponds to another detailed portion, another portion, an entire modification example or the like, regardless of the order of the description. In addition, redundant descriptions of identical portions will be omitted in principal. Further, each of the components in the embodiments is not always indispensable unless otherwise clearly specified, it is theoretically limited to a given number, or it is obvious from the context that the component is indispensable.

Likewise, in the description of the embodiments and the like, the wording such as "X made of A" used in association with a material, a composition or the like does not exclude those containing elements other than A unless otherwise clearly specified or it is obvious from the context that the material, the composition or the like only contains A. For instance, "X made of A" used for a component means "X containing A as a main component" or the like. It is needless to say that, for example, a "silicon member" or the like is not limited to a member made of pure silicon but includes a member made of a SiGe (silicon germanium) alloy or a multicomponent alloy containing silicon as a main component, and a member containing other additives and the like. In addition, a gold plating, a Cu layer, a nickel plating or the like is not limited to a member made of a pure component and includes a member respectively containing gold, Cu, nickel or the like as a main component unless otherwise clearly specified.

Further, when referring to a specified numerical value or a quantity, the numerical value may be less than or greater than the specified numerical value unless otherwise clearly specified, it is theoretically limited to the specified value or it is obvious from the context that the value may not be less than or greater than the specified value.

In addition, in all of the drawings of the embodiments, the same or identical portions are denoted by the same or similar symbols or reference signs, and redundant descriptions of the components are omitted in principle.

Further, in the attached drawings, hatched lines and the like are occasionally omitted even if the drawing is a cross section if the hatched lines make the drawings complicated or a difference between a member and a void is obvious. In this context, contour lines of a background are occasionally omitted even for a closed circle in plan view if it is obvious from the descriptions or the like. Furthermore, hatched lines or stippled dots are occasionally added even if the drawing is not a cross section in order to clarify that the portion is not a void or in order to clarify a boundary of a region.

Overview of Semiconductor Device

Figure 2:
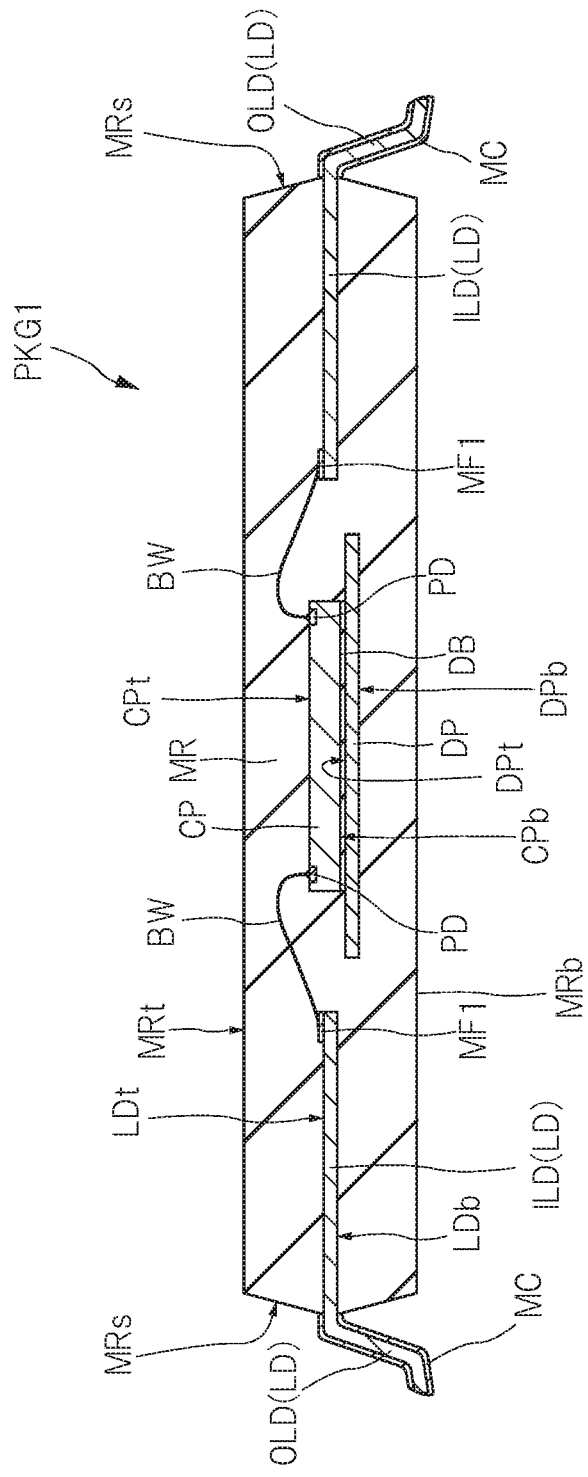
FIG. 2 is a cross-sectional view taken along a line A-A of FIG. 1.
Figure 3:
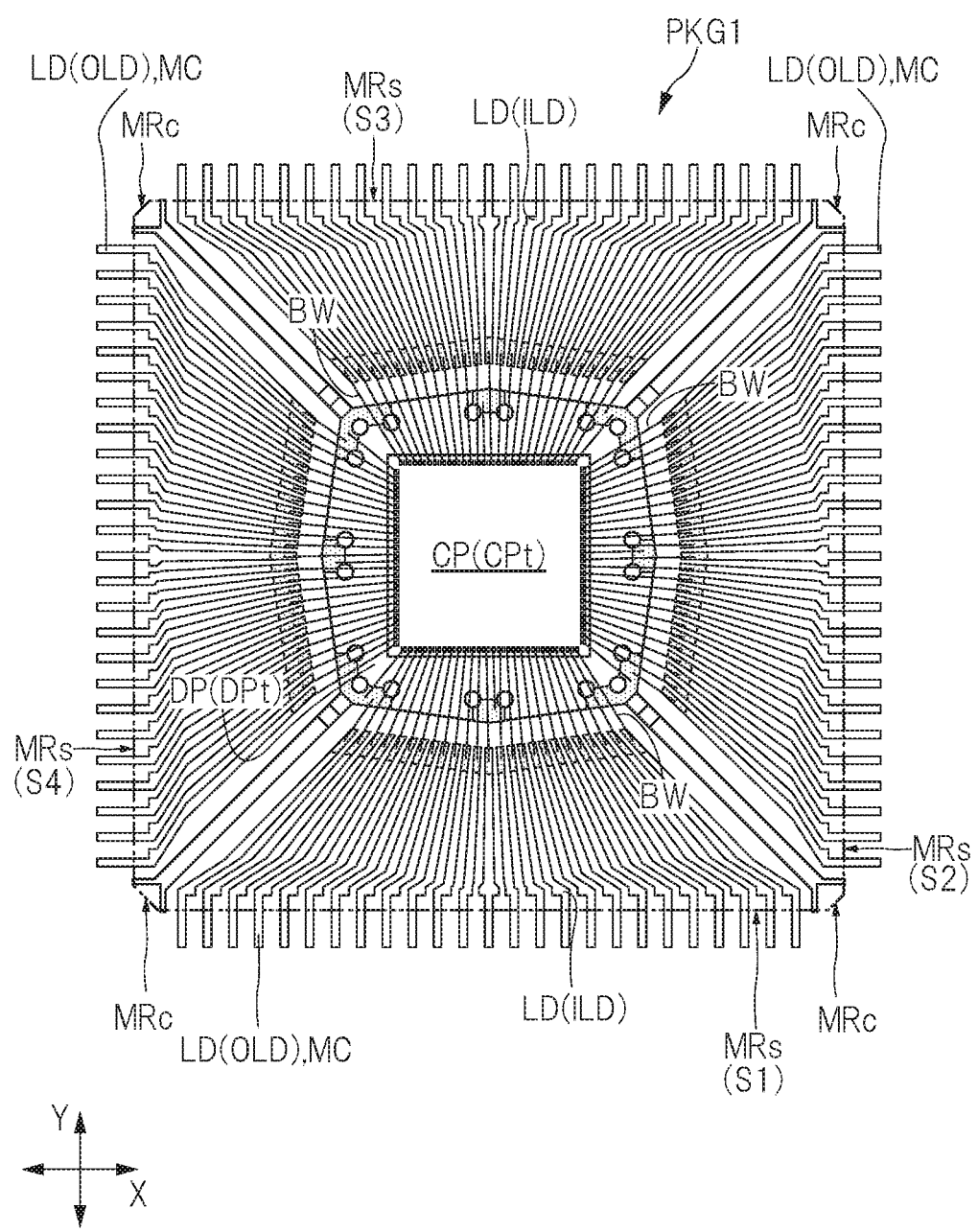
FIG. 3 is a perspective plan view showing an internal structure of the semiconductor device as seen through an encapsulation body shown in FIG. 1.
Figure 4:
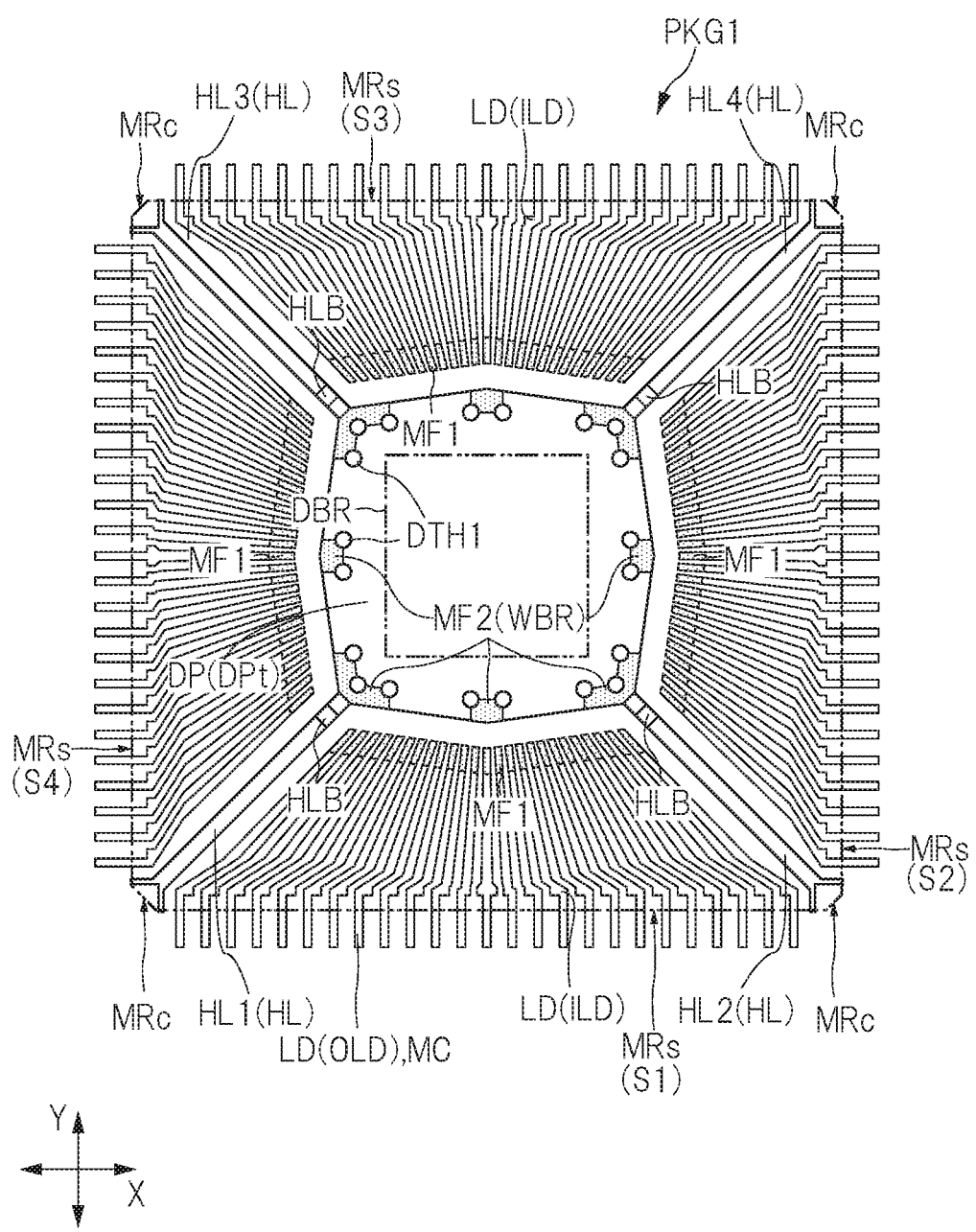
FIG. 4 is a perspective plan view showing a state in which a semiconductor chip and a plurality of wires shown in FIG. 3 are removed.

First, an overview of a configuration of a semiconductor device PKG1 according to one embodiment will be described with reference to FIGS. 1 to 4. FIG. 1 is a top view of the semiconductor device according to the present embodiment. In addition, FIG. 2 is a cross-sectional view taken along a line A-A of FIG. 1. Further, FIG. 3 is a perspective plan view showing an internal structure of the semiconductor device as seen through an encapsulation body shown in FIG. 1. Furthermore, FIG. 4 is a perspective plan view showing a state in which a semiconductor chip and a plurality of wires shown in FIG. 3 are removed.

As shown in FIGS. 1 to 4, the semiconductor device PKG1 includes a semiconductor chip CP (see FIGS. 2 and 3), a plurality of leads LD electrically connected to the semiconductor chip CP, and a plurality of wires BW (see FIG. 2) serving as conductive members electrically connecting the semiconductor chip CP and the plurality of leads LD to each other. In addition, the semiconductor chip CP and the plurality of wires BW are encapsulated in an encapsulation body (resin body) MR. Further, an inner lead portion ILD (see FIG. 2) of each of the plurality of leads LD is encapsulated in the encapsulation body MR, and an outer lead portion OLD of each of the plurality of leads LD is exposed to the outside of the encapsulation body MR.

As shown in FIG. 1, a planar shape of the encapsulation body MR within the semiconductor device PKG1 is quadrangular (quadrilateral). The encapsulation body MR includes a top surface MRt, a bottom surface (rear surface, mounting surface) MRb (see FIG. 2) located opposite to the top surface MRt, and side surfaces MRs located between the top surface MRt and the bottom surface MRb.

In addition, as shown in FIGS. 1 and 3, the encapsulation body MR includes a side (main side) S1 extending along an X direction in plan view, and a side (main side) S2 extending along a Y direction intersecting the X direction (or orthogonal to the X direction in FIG. 1) in plan view. Further, the encapsulation body MR includes a side S3 located opposite to the side S1 and extending along the X direction, and a side S4 located opposite to the side S2 and extending along the Y direction. As shown in FIG. 1, the four side surfaces MRs of the encapsulation body MR are arranged along each corresponding side of the encapsulation body MR. In addition, in the example shown in FIG. 1, a corner portion MRc located where two sides of the encapsulation body MR intersect is chamfered.

The corner portion MRc of the encapsulation body MR includes a corner peripheral region which is an intersecting point between two selected sides (two main sides) among the four sides (four main sides) of the encapsulation body MR. In particular, the corner portion MRc of the encapsulation body MR is chamfered (tapered in the example of FIG. 1; may instead be R-curved), meaning that the intersecting point between the main surfaces is located outside the corner portion MRc of the encapsulation body MR. However, since the chamfered portion is sufficiently smaller than a length of the main side, a center of the chamfered portion will be regarded as the corner of the encapsulation body MR in the present application. In other words, in the present application, if a region where two selected sides (two main sides) among the four sides (four main sides) of the encapsulation body MR intersect is chamfered, the chamfered portion corresponds to the corner portion MRc. On the other hand, if this region is not chamfered, the intersecting point between two selected sides (two main sides) corresponds to the corner portion MRc. Hereinafter, when describing the corner portion MRc of the encapsulation body MR in the present application, meanings and contents thereof are the same as those described above unless otherwise clearly specified that the meanings and contents differ.

In addition, in the semiconductor device PKG1, the plurality of leads LD are arranged along each side (each main side) of the encapsulation body MR having a quadrangular planar shape. Each of the plurality of leads LD is made of a metal material and, in the present embodiment, is a metal member containing, for example, copper (Cu) as a main component.

As shown in FIG. 2, the outer lead portion OLD of each of the plurality of leads LD protrudes from inside the encapsulation body MR to the outside of the encapsulation body MR at the side surface MRs of the encapsulation body MR. In addition, an exposed surface of the outer lead portion OLD of each of the plurality of leads LD has a metal film (outer plating film) MC formed over, for example, a front surface of a substrate containing copper as its main component. The metal film MC is made of, for example, a metal material such as solder which has a more satisfactory wettability to solder than a copper member serving as the substrate, and is a metal coating covering a front surface of the copper member serving as the substrate. By forming the metal film MC made of solder or the like over the outer lead portion OLD of each of the plurality of leads LD serving as an external terminal of the semiconductor device PKG1, wettability of the solder member serving as a conductive connecting member can be improved when mounting the semiconductor device PKG1 on a mounting substrate. This increases a bonding area between the plurality of leads LD and the solder member, so that bonding strength between the plurality of leads LD and terminals on the mounting substrate side can be enhanced.

The metal film MC is, for example, a Sn—Pb solder member containing lead (Pb) or a solder member made of a so-called lead-free solder substantially not containing Pb. Examples of the lead-free solder include those containing tin (Sn) only, tin-bismuth (Sn—Bi), tin-copper-silver (Sn—Cu—Ag), or tin-copper (Sn—Cu). Here, the lead-free solder refers to those containing 0.1 wt % or less of lead (Pb), and this content is defined as a standard of the RoHS (Restriction of Hazardous Substances) directive.

As shown in FIGS. 2 and 3, the semiconductor chip CP is encapsulated inside the encapsulation body MR. As shown in FIG. 3, the semiconductor chip CP is quadrangular in plan view and has a front surface CPt to which a plurality of pads (bonding pads) PD (see FIG. 2) are provided along each of the four sides constituting an outer edge of the front surface CPt. In addition, the semiconductor chip CP (specifically, a semiconductor substrate) is made of, for example, silicon (Si). Although not shown, a plurality of semiconductor elements (circuit elements) are formed on a main surface of the semiconductor chip CP (specifically, a semiconductor element forming region on the top surface of the semiconductor substrate of the semiconductor chip CP). Further, the plurality of pads PD are electrically connected to this semiconductor element via wirings (not shown) formed in a wiring layer arranged inside the semiconductor chip CP (specifically, in a region between the front surface CPt and the semiconductor element forming region (not shown)). In other words, the plurality of pads PD are electrically connected to circuits formed in the semiconductor chip CP.

In addition, an insulating film covering the substrate and the wirings of the semiconductor chip CP is formed over the front surface CPt of the semiconductor chip CP, and the front surface of each of the plurality of pads PD (see FIG. 2) is exposed through an opening formed in this insulating film. Further, in the present embodiment, these pads PD are made of metal and are made of, for example, aluminum (Al).

In addition, as shown in FIG. 3, the plurality of leads LD are arranged around the semiconductor chip CP (that is, around a die pad DP). The plurality of leads LD are arranged at positions facing the die pad DP in plan view. Each of the plurality of pads (bonding pads) PD (see FIG. 2) on the front surface CPt of the semiconductor chip CP is electrically connected to the inner lead portion ILD of each of the plurality of leads LD located inside the encapsulation body MR via a wire (conductive member) BW. The wire BW is made of, for example, gold (Au) or copper (Cu), and has one portion (such as one end) bonded to the pad PD and another portion (such as the other end) bonded to a wire-bonding region at a tip portion of the inner lead portion ILD (region to which a portion of the wire BW is connected).

In addition, a metal film (plating film, plated-metal film) MF1 (see FIG. 2) is formed over the wire-bonding region at the tip portion of the inner lead portion ILD. As shown in FIG. 2, the metal film MF1 is partially formed over a portion (a top surface (front surface) LDt of the tip portion closest to the die pad DP) of the inner lead portion ILD. The metal film MF1 is made of a material containing, for example, silver (Ag) or gold (Au) as a main component. By forming the metal film MF1 made of a material containing silver or gold as a main component over a portion of the inner lead portion ILD to which the wire BW is connected, bonding strength with the wire BW made of gold can be enhanced.

In addition, in the case of the semiconductor device PKG1, some of the plurality of wires BW are connected to the die pad DP. Details regarding a region of the die pad DP to which the wire BW is connected will be described below.

As shown in FIG. 2, the semiconductor chip CP is mounted on the die pad DP serving as a chip mounting portion. The die pad DP comprises a top surface (main surface, chip mounting surface) DPt and a bottom surface (main surface, rear surface) DPb opposite to the top surface DPt. The semiconductor chip CP is mounted on the top surface DPt of the die pad DP. In the example shown in FIG. 4, the top surface DPt of the die pad DP is octagonal and has an area that is larger than an area of the front surface CPt of the semiconductor chip CP. The die pad DP is a supporting member supporting the semiconductor chip CP, and there are various modification examples of the shape and size thereof besides those of the example shown in FIG. 4. For example, a planar shape of the die pad DP may be polygonal with four or more sides, or may be circular or elliptical.

In addition, the semiconductor chip CP is mounted on a die-bonding region DBR (see FIG. 4) at a center of the top surface DPt of the die pad DP. As shown in FIG. 2, the semiconductor chip CP is mounted on the die pad DP via a die-bonding member (adhesive member) DB, with a rear surface CPb of the semiconductor chip CP facing the top surface DPt of the die pad DP. In other words, the semiconductor chip CP is mounted by the so-called face-up mounting technique in which the surface (rear surface CPb) opposite to the front surface (main surface) CPt on which the plurality of pads PD are formed faces the chip mounting surface (top surface DPt). This die-bonding member DB serves as an adhesive member used when die-bonding the semiconductor chip CP, and uses, for example, a resin adhesive having an epoxy-based thermosetting resin containing metal particles made of silver or the like, or a metal bonding member such as a solder member. A detailed structure of a periphery of the die pad will be described below.

As shown in FIG. 4, a plurality of suspension leads HL extending from a peripheral portion of the die pad DP to a peripheral portion of the encapsulation body MR are arranged around the die pad DP. Each of the suspension leads HL is a member supporting the die pad DP at a supporting portion (frame portion) of a lead frame during a manufacturing process of the semiconductor device PKG1 and has one end connected to the die pad DP. In the example shown in FIG. 4, each of the four suspension leads HL1, HL2, HL3 and HL4 extending from a portion of the die pad DP to the corresponding corner portion MRc of the encapsulation body MR is connected to the die pad DP. A group of leads including the plurality of leads LD is arranged between the suspension lead HL1 and the suspension lead HL2.

Specifically, one end of each of the plurality of suspension leads HL is connected to the corresponding corner portion (corner) of the die pad DP. The other end of each of the plurality of suspension leads HL extends toward the corresponding corner portion MRc of the encapsulation body MR and branches into two portions in the vicinity of the corner portion MRc so as to be exposed to the outside of the encapsulation body MR at the side surface MRs of the encapsulation body MR (see FIG. 1). By extending each of the suspension leads HL to the corresponding corner portion MRc of the encapsulation body MR, arrangement of the plurality of leads LD arranged along each side (each main side) of the encapsulation body MR is less likely to be blocked by the suspension leads HL.

In addition, as shown in FIG. 2, the top surface DPt of the die pad DP and the top surface of the inner lead portion ILD of the lead LD of the present embodiment are arranged at different heights. In the example shown in FIG. 2, the top surface DPt of the die pad DP is arranged at a lower position than the top surface LDt of the inner lead portion ILD. Thus, each of the plurality of suspension leads HL shown in FIG. 4 is provided with an offset portion (bent portion, downset portion in the example of the present embodiment) HLB bent such that the top surface DPt (see FIG. 2) of the die pad DP is located at a height that differs from the top surface LDt of the inner lead portion ILD of the lead LD.

In addition, as shown in FIG. 2, the semiconductor chip CP, the die pad DP, the plurality of wires BW and the plurality of leads LD are encapsulated in the encapsulation body MR. Specifically, the semiconductor chip CP, the die pad DP and the plurality of wires BW are entirely encapsulated in the encapsulation body MR, whereas each of the plurality of leads LD has one portion (inner lead portion ILD) encapsulated in the encapsulation body MR and another portion (outer lead portion OLD) exposed to the outside of the encapsulation body MR.

Generally, there is a semiconductor package having a configuration in which a portion (such as the bottom surface DPb) of the die pad DP is exposed to the outside of the encapsulation body MR. However, in the case of the present embodiment, the top surface DPt and the bottom surface DPb of the die pad DP are both encapsulated in the encapsulation body MR. In other words, the encapsulation body MR includes a portion (first portion) formed over the top surface of the die pad DP and a portion (second portion) formed under the bottom surface of the die pad DP. As will be described in detail below, in the case of the semiconductor device PKG1, by connecting the first portion and the second portion of the encapsulation body MR sandwiching the die pad DP to each other, the die pad DP and the encapsulation body MR are suppressed from moving in mutually different directions even if delamination occurs between the die pad DP and the encapsulation body MR. Thus, even if delamination occurs, damage to the bonding portion of the wire BW can be suppressed.

Details of Top Surface of Die Pad

Figure 5:
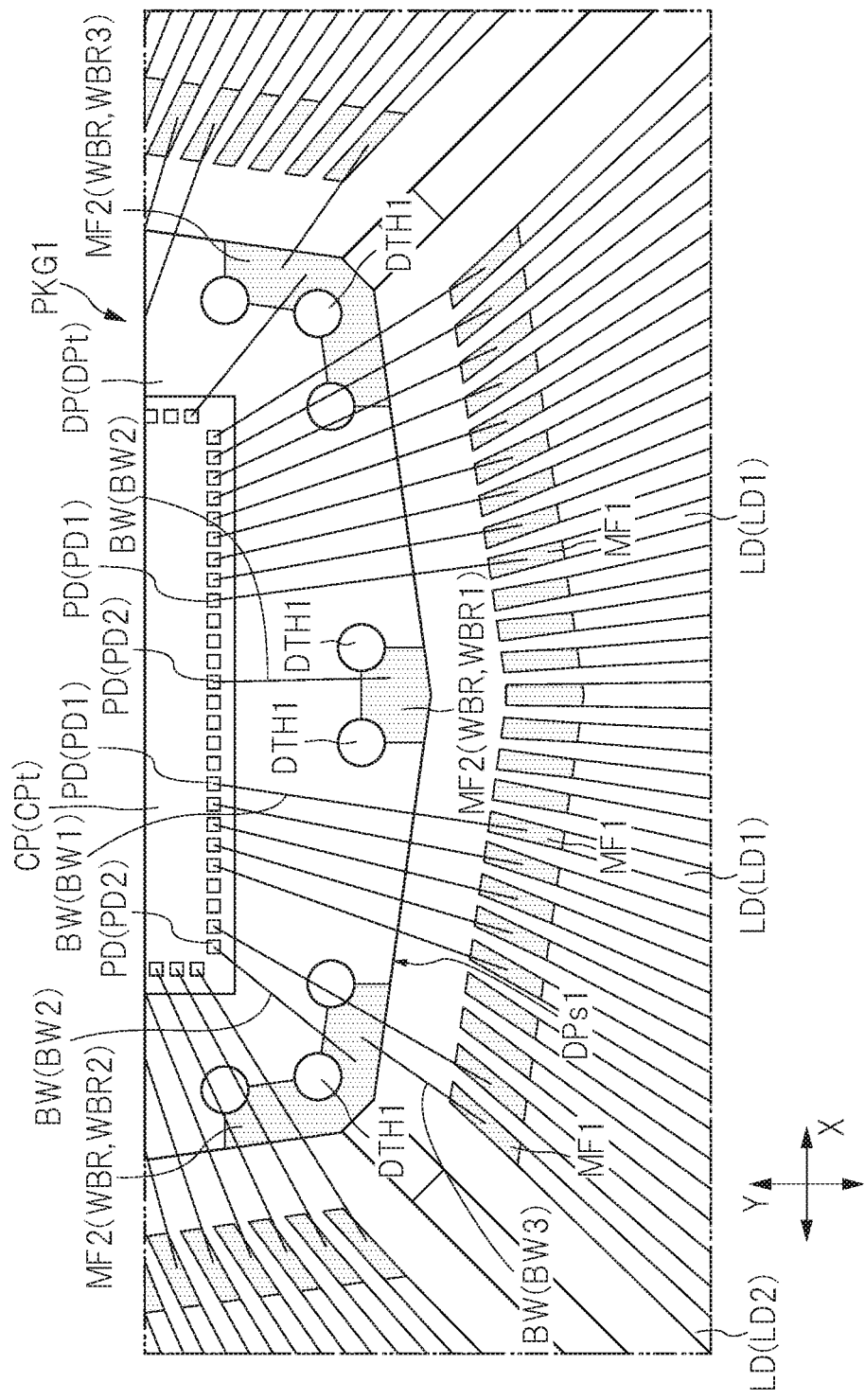
FIG. 5 is an enlarged plan view showing a region in which the wire is connected to the die pad and each of the plurality of leads shown in FIG. 3.

Next, the structure of the periphery of the die pad shown in FIG. 4 will be described. FIG. 5 is an enlarged plan view showing a region in which the wire is connected to the die pad and each of the plurality of leads shown in FIG. 3. In FIG. 5, the number of wires shown in FIG. 3 is reduced for the sake of clarity.

As shown in FIG. 5, the plurality of pads PD of the semiconductor chip CP include a pad PD1 electrically connected to the lead LD via a wire BW1, and a pad PD2 electrically connected to a wire-bonding region WBR of the die pad DP via a wire BW2. In the example of the present embodiment, the plurality of wires BW include a wire BW3 connecting the wire-bonding region WBR of the die pad DP and a lead LD2 to each other in addition to the above-described wire BW1 and wire BW2. Further, the plurality of leads LD include a lead LD1 connected to the pad PD1 of the semiconductor chip CP and the lead LD2 connected to the wire-bonding region WBR of the die pad DP.

The wire BW1 has one end connected to the pad PD1 of the semiconductor chip CP and the other end connected to the metal film MF1 of the lead LD1. The wire BW2 has one end connected to the pad PD2 of the semiconductor chip CP and the other end connected to a metal film MF2 in the wire-bonding region WBR of the die pad DP. The wire BW3 has one end connected to the metal film MF2 in the wire-bonding region WBR of the die pad DP and the other end connected to the metal film MF1 of the lead LD2.

In the case of the semiconductor device PKG1, a reference potential (such as a ground potential) which is supplied to a circuit within the semiconductor chip CP is supplied via the die pad DP. In the example shown in FIG. 5, the reference potential is supplied from the lead LD2 to the die pad DP via the wire BW3, and from the die pad DP to the pad PD of the semiconductor chip CP via the wire BW2. Thus, by interposing a conductive pattern having a large area such as the die pad DP in a supply path of the reference potential and connecting via the plurality of wires BW2 and plurality of pads PD2, the reference potential supplied to the circuit of the semiconductor chip CP can be stabilized.

Note that, in the case of the semiconductor device PKG1, an example in which the potential is supplied to the die pad DP via the wire BW3 and lead LD2 is described. However, there are various modification examples regarding the method of supplying potential to the die pad DP. For example, a portion of the suspension lead HL shown in FIG. 4 that is exposed to the outside of the encapsulation body MR may have the same shape as the outer lead portion OLD of the lead LD. In this case, the suspension lead HL can be used as a lead for supplying the potential.

In addition, the die pad DP includes the die-bonding region DBR (see FIG. 4) overlapping the semiconductor chip CP, and the wire-bonding region WBR arranged outside the die-bonding region DBR in plan view and to which the wire BW2 is connected.

In the case where the wire BW2 or the wire BW3 made of gold or the like is connected to the die pad DP made of metal containing, for example, copper as a main component as in the present embodiment, it is preferable that the metal film (plating film, plated-metal film) MF2 is formed in the wire-bonding region WBR of the die pad DP and that the wires BW2 and BW3 are connected to the metal film MF2. The metal film MF2 is made of material containing, for example, silver (Ag) or gold (Au) as a main component. The metal film MF2 is made of the same metal material as the metal film MF1 formed over the top surface of the tip portion of each of the plurality of leads LD, and is formed by a plating method. In the case where the wires BW2 and BW3 are bonded to the metal film MF2, strength of the bonding portion can be enhanced as compared to the case where the wires BW2 and BW3 are directly bonded to the substrate of the die pad DP. Thus, connection reliability of the wires BW2 and BW3 in the wire-bonding region WBR of the die pad DP can be improved.

However, the metal film MF2 made of a metal material containing silver or gold as a main component has a lower adhesive strength with respect to the encapsulation body MR shown in FIG. 2 as compared to the substrate of the die pad DP made of copper. For example, in the case where a reflow process at the time of mounting or a thermal load such as a temperature cycle load is applied to the semiconductor device PKG1, a difference between a linear expansion coefficient of the encapsulation body MR and a linear expansion coefficient of the die pad DP causes stress to be generated in the adhesive interface between the die pad DP and the encapsulation body MR. In the case of a metal pattern having a large area as in the die pad DP, the stress caused by the thermal load becomes the largest at the peripheral portion of the die pad DP. Thus, when the stress caused by the thermal load is generated, delamination is likely to occur between the die pad DP and the encapsulation body MR at the peripheral portion of the die pad DP. In particular, in the case where the metal film MF2 and the encapsulation body MR are adhered to each other in the wire-bonding region WBR at the peripheral portion of the die pad DP, delamination is more likely to occur in the adhesive interface between the metal film MF2 and the encapsulation body MR than in the adhesive interface between the substrate of the die pad DP and the encapsulation body MR.

In addition, when delamination occurs in the adhesive interface between the metal film MF2 and the encapsulation body MR in the wire-bonding region WBR, delamination tends to progress along the top surface DPt of the die pad DP. In the case where delamination occurs between the die pad DP and the encapsulation body MR in a wide area around the wire-bonding region WBR, the die pad DP and the encapsulation body MR formed over the die pad DP move independently from each other. In the case where the encapsulation body MR formed over the die pad DP and the wire-bonding region WBR of the die pad DP move in different directions, the stress is concentrated on the bonding portion of the wire BW fixed to the wire-bonding region WBR. As a result, the bonding portion of the wire BW is occasionally damaged by the stress.

However, the inventor of the present invention has studied the above and has found that it would be difficult to reliably prevent delamination from occurring between the metal film MF2 and the encapsulation body MR. Therefore, the inventor of the present invention has studied techniques for reducing the stress applied to the wires BW2 and BW3 that are bonded to the wire-bonding region WBR when delamination occurs between the metal film MF2 and the encapsulation body MR in the wire-bonding region WBR of the die pad DP.

First, as shown in FIG. 5, the wire-bonding region WBR is covered by the metal film MF2 partially covering the top surface DPt of the die pad DP. The wire BW2 is bonded to the metal film MF2 in the wire-bonding region WBR. In the present embodiment, in order to enhance bonding strength of the wire BW2, the metal film MF2 is formed in the wire-bonding region WBR of the die pad DP. However, since delamination tends to occur between the metal film MF2 and the encapsulation body MR (see FIG. 2), a region of the top surface DPt of the die pad DP in which the metal film MF2 is to be arranged is limited to a periphery of a portion to which the wire BW2 (or the wire BW3) is bonded.

For example, in the example shown in FIG. 5, the peripheral portion of the die pad DP includes a side DPs1 facing the plurality of leads LD. The die pad DP includes a wire-bonding region WBR1 and a wire-bonding region WBR2 that are arranged along the side DPs1 and are each electrically connected to the pad PD2 of the semiconductor chip CP via the wire BW2. Each of the wire-bonding regions WBR1 and wire-bonding region WBR2 is covered by the metal film MF2. The metal film MF2 in the wire-bonding region WBR1 and the metal film MF2 in the wire-bonding region WBR2 are spaced apart from each other in plan view, and a non wire-bonding region not covered by the metal film MF2 is interposed between the wire-bonding region WBR1 and the wire-bonding region WBR2.

When delamination occurs between the die pad DP and the encapsulation body MR (see FIG. 2), a location where delamination is most likely to occur is a starting point of delamination, meaning that the portion where the encapsulation body MR and the metal film MF2 are adhered to each other is the starting point of delamination. In the case of the structure of the semiconductor device PKG1, the metal film MF2 is partially formed over the wire-bonding region WBR on the top surface DPt of the die pad DP, so that the location of the starting point of delamination can be controlled.

Figure 6:
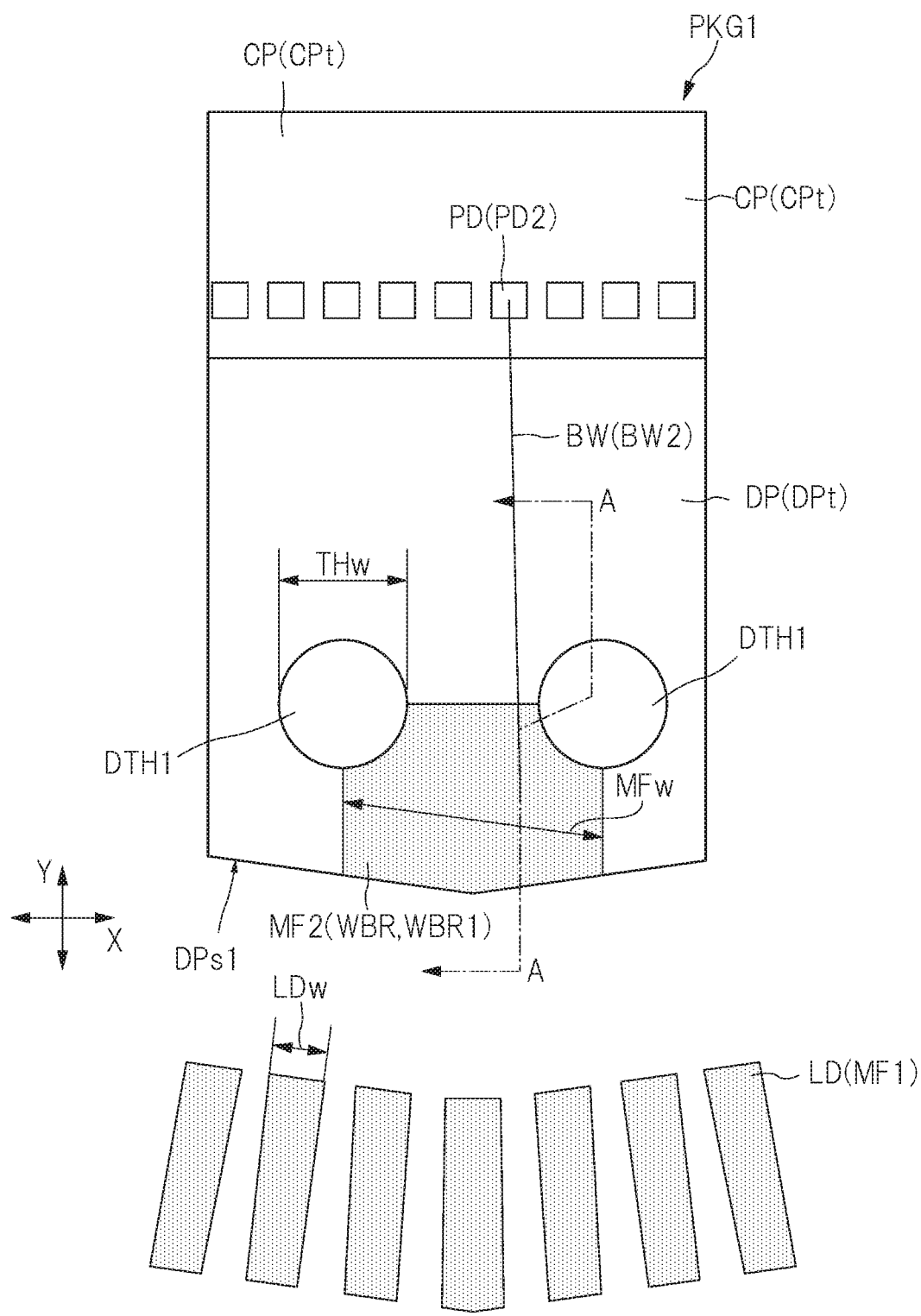
FIG. 6 is an enlarged plan view showing a further enlarged wire-bonding region among the plurality of wire-bonding regions shown in FIG. 5.
Figure 14:
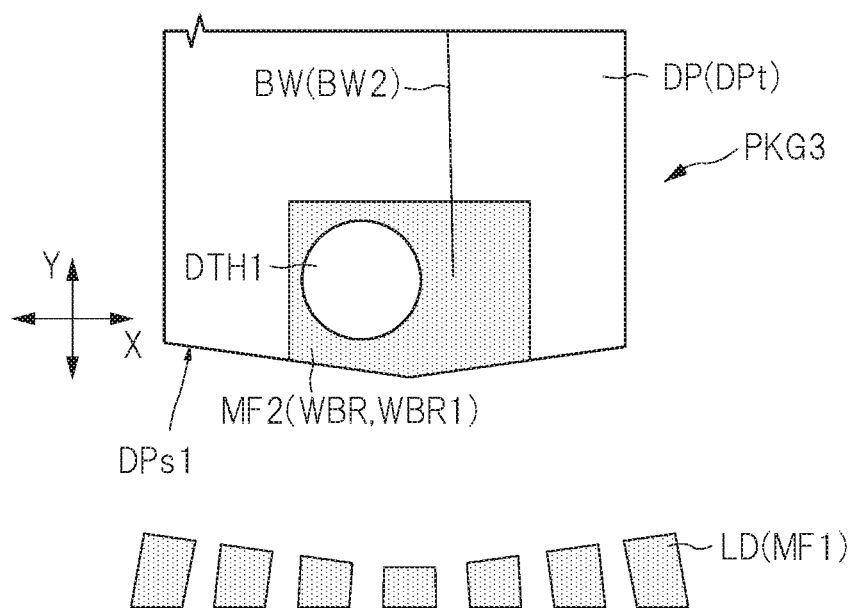
FIG. 14 is an enlarged plan view showing another modification example of FIG. 6.

In addition, the semiconductor device PKG1 has a through hole DTH1 formed at a position overlapping the metal film MF2 or in a periphery of the metal film MF2. In the example shown in FIG. 5, the through hole DTH1 is formed at a position overlapping each of the metal film MF2 in the wire-bonding region WBR1 and the metal film MF2 in the wire-bonding region WBR2. Note that the wording "the through hole DTH1 formed at a position overlapping the metal film MF2" means that the through hole DTH1 is formed so as to have a positional relation in which at least a portion of a peripheral portion of the through hole DTH1 and the metal film MF2 are in mutual contact (that is, the positional relation in which at least a portion of a peripheral portion of the through hole DTH1 and the metal film MF2 are in mutual contact without being separated from each other). For example, as shown in FIG. 6, in addition to the case where at least a portion of the peripheral portion of the through hole DTH1 is in contact with the peripheral portion of the metal film MF2, the case where the entire peripheral portion of the through hole DTH1 is in contact with the metal film MF2 as shown in FIG. 14 described below may also be regarded as "the through hole DTH1 formed at a position overlapping the metal film MF2".

Figure 7:
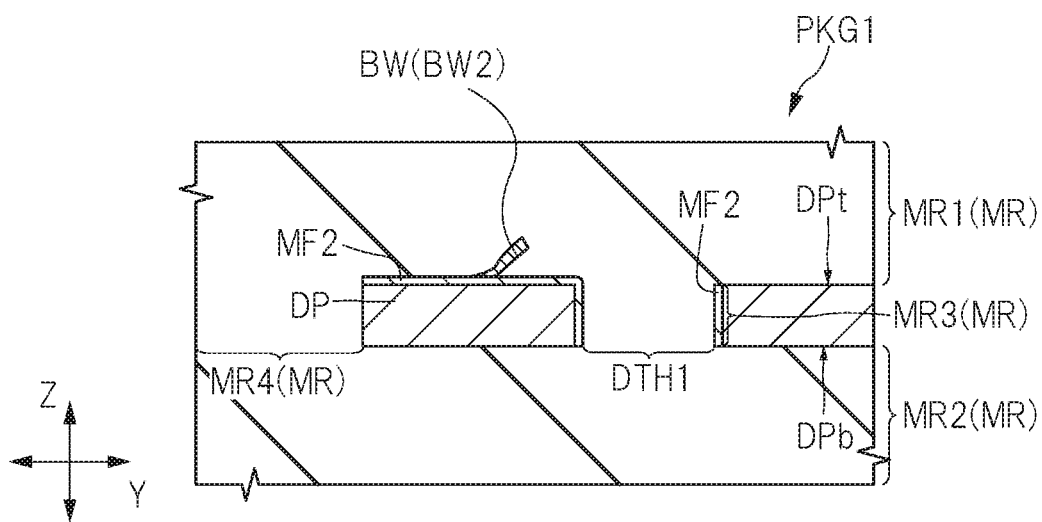
FIG. 7 is an enlarged cross-sectional view taken along a line A-A of FIG. 6.
Figure 8:
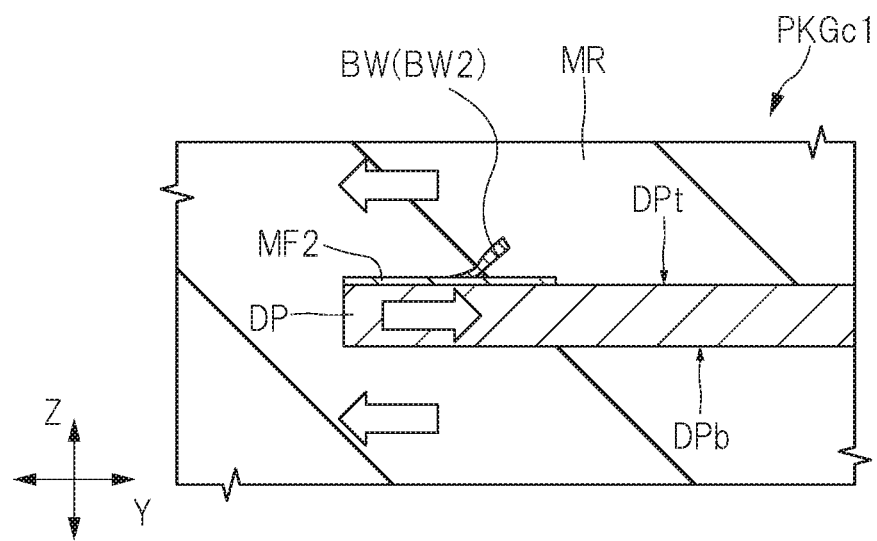
FIG. 8 is an enlarged cross-sectional view showing a studied example with respect to the semiconductor device shown in FIG. 7.
Figure 9:
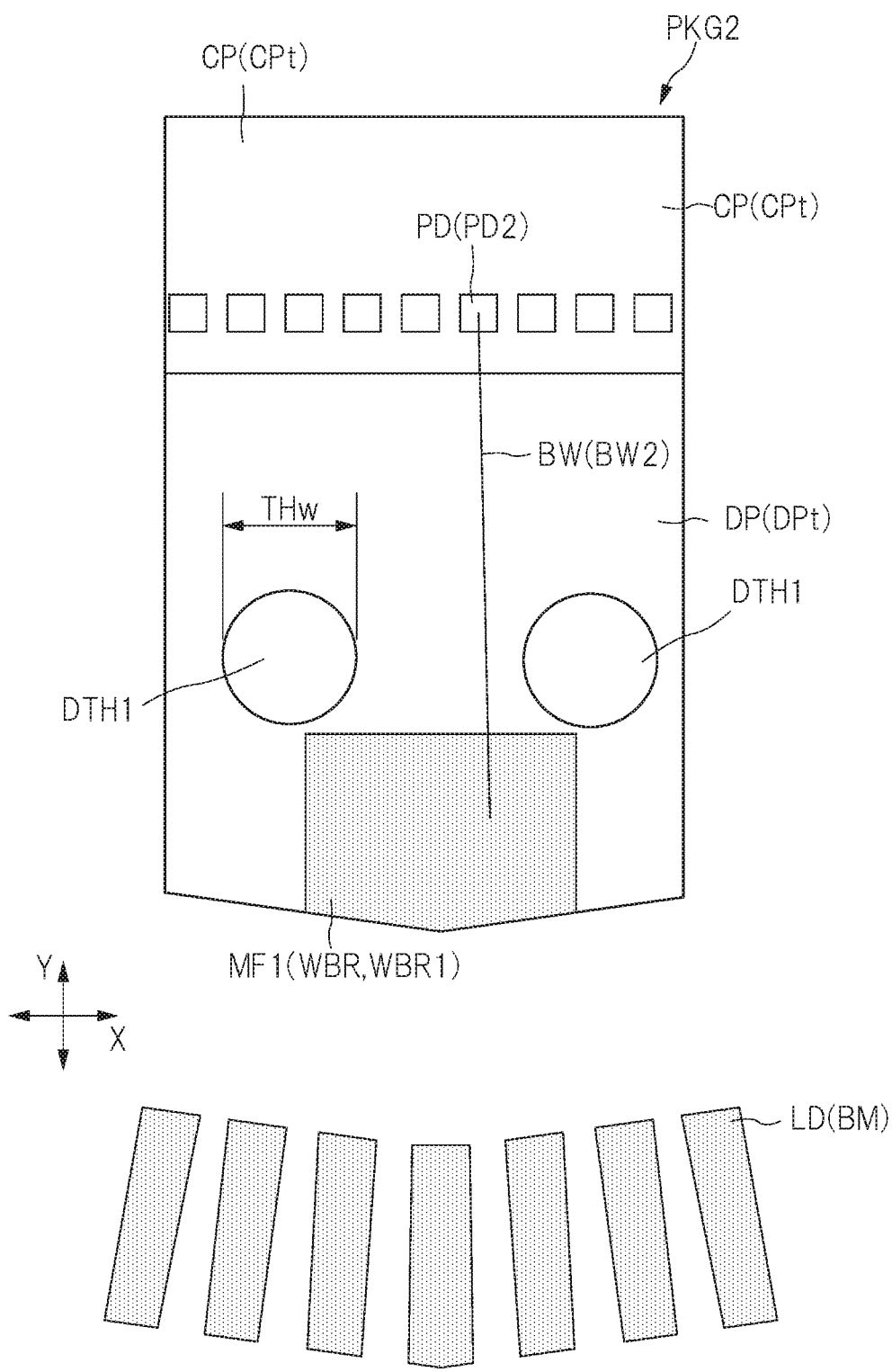
FIG. 9 is an enlarged plan view showing a modification example of the semiconductor device shown in FIG. 6.

Hereinafter, functions and effects of forming the through hole DTH1 to suppress progress of delamination will be described. FIG. 6 is an enlarged plan view showing a further enlarged wire-bonding region among the plurality of wire-bonding regions shown in FIG. 5. FIG. 7 is an enlarged cross-sectional view taken along a line A-A of FIG. 6. FIG. 8 is an enlarged cross-sectional view showing a studied example with respect to the semiconductor device shown in FIG. 7. FIG. 9 is an enlarged plan view showing a modification example of the semiconductor device shown in FIG. 6.

A semiconductor device PKGc1 shown in FIG. 8 differs from the semiconductor device PKG1 shown in FIG. 7 in that the through hole DTH1 shown in FIG. 7 is not formed in the die pad DP. As schematically indicated by arrows in FIG. 8, in the case where delamination occurs between the encapsulation body MR and the die pad DP and these members move (or are deformed) in mutually different directions, the positional relation between the encapsulation body MR and the die pad DP is deviated. At this time, the wire BW2 is encapsulated in the encapsulation body MR and is fixed to the die pad DP, so that the stress is concentrated on the bonding portion between the wire BW2 and the die pad DP. This stress causes damage to the bonding portion of the wire BW2. Thus, the inventor has studied a method of reducing the stress applied to the bonding portion between the wire BW2 and the die pad DP when delamination occurs between the encapsulation body MR and the die pad DP.

As shown in FIG. 7, the die pad DP of the semiconductor device PKG1 of the present embodiment includes the through hole DTH1 penetrating through the die pad DP from the top surface DPt to the bottom surface DPb. The through hole DTH1 is formed at a position overlapping the metal film MF2. In this case, the encapsulation body MR has the following structure in the periphery of the die pad DP. Namely, the encapsulation body MR includes a portion MR1 formed over the top surface DPt of the die pad DP, a portion MR2 formed under the bottom surface DPb of the die pad DP, and a portion MR3 buried in the through hole DTH1 of the die pad DP. The portion MR1 and the portion MR2 of the encapsulation body MR are connected to each other via the portion MR3.

In the semiconductor device PKG1, even if force is applied in the direction indicated by the arrows in FIG. 8, the portion MR3 of the encapsulation body MR restricts free movement of the encapsulation body MR and die pad DP. Thus, the stress that is caused by delamination occurring between the encapsulation body MR and the die pad DP and is applied to the bonding portion between the wire BW2 and the die pad DP can be reduced. In other words, some of the stress generated when force is applied in the directions indicated by the arrows in FIG. 8 is applied to the portion MR3 of the encapsulation body MR. Thus, the stress applied to the bonding portion between the wire BW2 and the die pad DP can be reduced. In this manner, the portion MR3 buried in the through hole DTH1 functions as a stress-alleviating member that alleviates the stress applied to the bonding portion between the wire BW2 and the die pad DP.

Even if the metal film MF2 and the through hole DTH1 do not overlap each other as in the die pad DP within a semiconductor device PKG2 shown in FIG. 9, an effect of the stress-alleviating member can be obtained as long as the through hole DTH1 is formed around the metal film MF2. However, in order to increase the effect of the stress-alleviating member, it is preferable that a separation distance between the through hole DTH1 and the bonding portion between the wire BW2 and the die pad DP is short. Even in the case where the through hole DTH1 is formed around the metal film MF2 such that the through hole DTH1 and the metal film MF2 are spaced apart from each other as shown in FIG. 9, it is preferable that the separation distance between the through hole DTH1 and the metal film MF2 is shorter than an opening width of the through hole DTH1. In this case, the opening width of the through hole DTH1 is defined as the shortest length of an opening shape of the through hole DTH1 in plan view. For example, in the case of the example shown in FIG. 9, the opening shape of the through hole DTH1 is circular in plan view, so that the opening width THw of the through hole DTH1 is defined as a diameter of the circle. In addition, in the case where an opening length (opening width THw1) in the X direction and an opening length (opening width THw2) in the Y direction orthogonal to the X direction differ from each other as in the modification examples shown in FIG. 12, the opening width of the through hole DTH1 is defined as the relatively shorter opening width THw2. For example, in the case where the opening shape of the through hole DTH1 is elliptical, the opening width of the through hole DTH1 is defined as the shorter diameter (opening width THw2) of the ellipse. In addition, in the case where the opening shape of the through hole DTH1 is rectangular, the opening width of the through hole DTH1 is defined as a length (opening width THw2) of a short side of the rectangle.

In the case of the semiconductor device PKG1 shown in FIGS. 6 and 7, the through hole DTH1 is formed at a position overlapping the metal film MF2. Thus, the separation distance between the through hole DTH1 and the bonding portion between the wire BW2 and the die pad DP can be reduced. If the separation distance is small, deformation of the encapsulation body MR and die pad DP in the vicinity of the bonding portion can be suppressed. For example, in the case where delamination occurring in the adhesive interface between the encapsulation body MR and the metal film MF2 progresses across a wide range, a movable range of the encapsulation body MR and die pad DP increases, so that the force schematically indicated by the arrows in FIG. 8 increases. However, by reducing the separation distance between the through hole DTH1 and the bonding portion between the wire BW2 and the die pad DP, large movement of the encapsulation body MR and die pad DP in the vicinity of the bonding portion is suppressed. In addition, the majority of the stress generated by suppressing the large movement of the encapsulation body MR and die pad DP is alleviated by the portion MR3 of the encapsulation body MR, so that damage to the bonding portion can be suppressed.

In the case of the semiconductor device PKG1 shown in FIG. 4, the die pad DP comprises eight wire-bonding regions WBR, and each of the wire-bonding regions WBR is covered by the metal film MF2. In addition, a plurality of through holes DTH1 are formed in each of the wire-bonding regions WBR. The plurality of metal films MF2 formed over the top surface DPt of the die pad DP include a film formed over an extended line of the suspension lead HL in plan view and a film formed at a position that differs from the extended line of the suspension lead HL.

Figure 10:
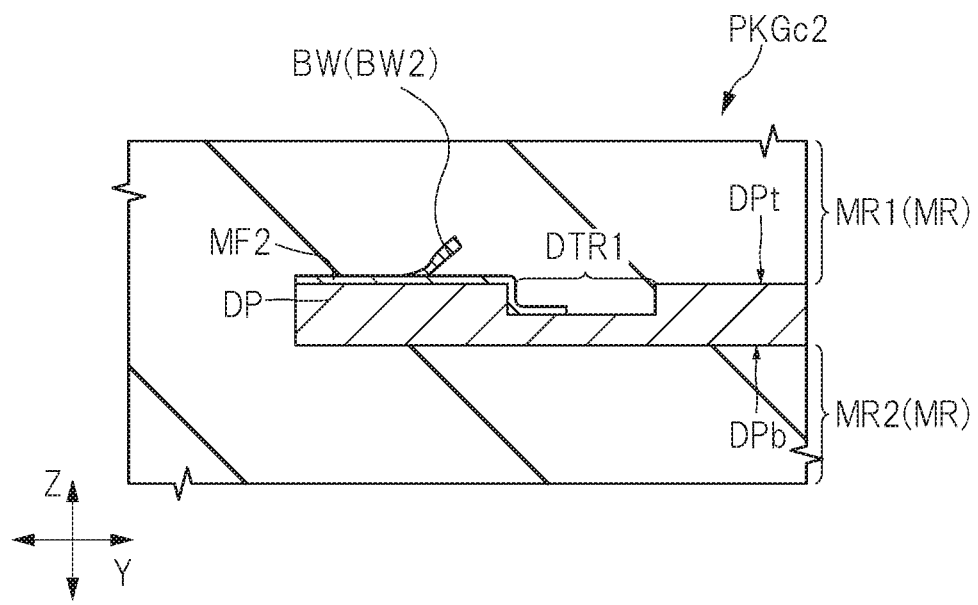
FIG. 10 is an enlarged cross-sectional view showing another studied example with respect to the semiconductor device shown in FIG. 7.
Figure 11:
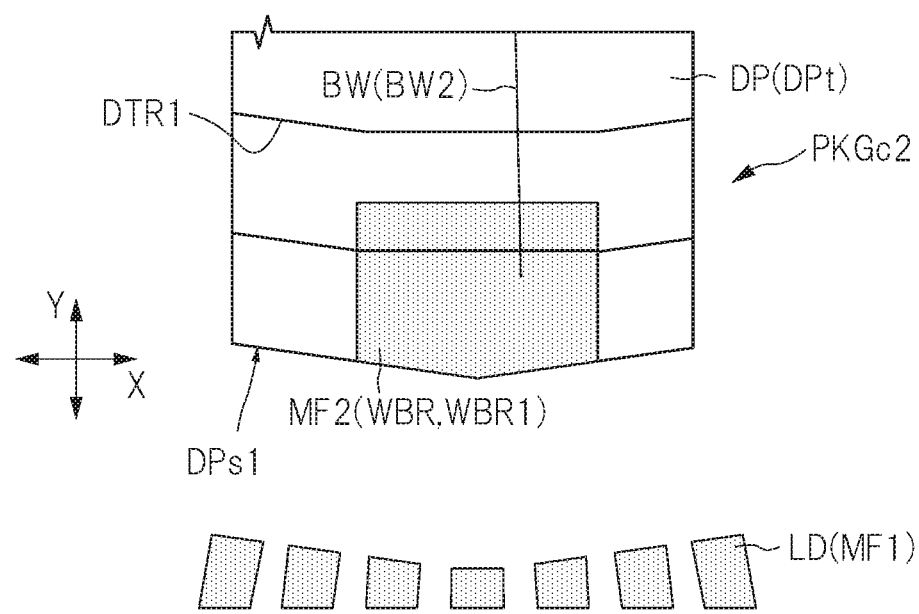
FIG. 11 is an enlarged plan view showing the semiconductor device shown in FIG. 10.

In addition to the through hole DTH1 shown in FIG. 7, the inventor of the present invention has also studied a structure as shown in FIGS. 10 and 11. FIG. 10 is an enlarged cross-sectional view showing another studied example with respect to the semiconductor device shown in FIG. 7. FIG. 11 is an enlarged plan view showing the semiconductor device shown in FIG. 10.

The semiconductor device PKGc2 shown in FIGS. 10 and 11 differs from the semiconductor device PKG1 shown in FIG. 6 in that the through hole DTH1 shown in FIGS. 6 and 7 is not formed, and instead, a trench DTR1 is formed along an extending direction of the side DPs1 at the peripheral portion of the die pad DP. The trench DTR1 is formed in the die pad DP so as to extend from the top surface DPt toward the bottom surface DPb but does not penetrate through the die pad DP.

In the case of the semiconductor device PKGc2, when delamination occurs in the adhesive interface between the metal film MF2 and the encapsulation body MR, delamination progresses from the peripheral portion side of the die pad DP toward the inside. As shown in FIG. 11, the trench DTR1 is arranged along the peripheral portion of the die pad DP so as to surround the semiconductor chip CP (see FIG. 6), so that progress of delamination can be suppressed by a step portion of the trench DTR1. However, for example, if the temperature cycle load or the like were repeatedly applied, it would be difficult to reliably prevent progress of delamination. Further, in the case of the semiconductor device PKGc2, although the encapsulation body MR is provided with a portion buried in the trench DTR1, capability of suppressing deformation of the encapsulation body MR and die pad DP (that is, capability of alleviating the stress applied to the wire BW2) of this portion buried in the trench DTR1 is relatively lower than that of the portion MR3 shown in FIG. 7. In addition, in the case where delamination occurs between the die pad DP and the portion buried in the trench DTR1 of the encapsulation body MR, the buried portion occasionally falls out from the trench DTR1. If the portion buried in the trench DTR1 falls out from the trench DTR1, the above-described function cannot be obtained.

On the other hand, in the case of the portion MR3 buried in the through hole DTH1 shown in FIG. 7, the portion MR3 is connected to the portion MR1 and the portion MR2 of the encapsulation body MR, so that the portion MR3 does not fall out from the through hole DTH1 unless the portion MR3 is destroyed. Thus, in the case where the stress generated by suppressing the large movement of the encapsulation body MR and die pad DP is smaller than a destruction strength of the portion MR3, the stress applied to the wire BW2 can be stably reduced.

In addition, although not shown, the inventor has studied a case where the trench DTR1 shown in FIGS. 10 and 11 is a slit (a through trench) penetrating through the die pad DP in a thickness direction (Z direction of FIG. 10). In the case where the trench DTR1 shown in FIGS. 10 and 11 is a slit penetrating through the die pad DP in the thickness direction, a function to suppress deformation of the encapsulation body MR and die pad DP (that is, a function to alleviate the stress applied to the wire BW2) can be stably obtained as in the case of the semiconductor device PKG1 shown in FIGS. 6 and 7. In addition, by using the slit to separate the location where delamination is likely to occur and the location where delamination is less likely to occur, progress of delamination can be suppressed. However, it was found that another problem arises in this case.

As shown in FIGS. 2 and 10, in the case of the semiconductor device having the bottom surface DPb of the die pad DP not exposed to the outside of the encapsulation body MR, heat dissipation properties for dissipating the heat of the semiconductor chip CP to the outside is deteriorated as compared to the semiconductor device having the bottom surface DPb of the die pad DP exposed to the outside of the encapsulation body MR. In the case of a semiconductor device as in the semiconductor device PKG1 in which the entire die pad DP is encapsulated in the encapsulation body MR, the plurality of leads arranged so as to face the die pad DP in plan view can be utilized as a main heat dissipation path. Although the plurality of leads LD and the die pad DP are spaced apart from each other, a heat path in which the heat generated in the semiconductor chip CP is discharged to the lead LD via the die pad DP is also considered as a main heat dissipation path.

However, in the case where the trench DTR1 shown in FIGS. 10 and 11 is a slit penetrating through the die pad DP in the thickness direction as described above, the heat dissipation path is divided by the slit, whereby heat is less likely to be transmitted to the peripheral portion of the die pad DP. Namely, in the case where a long slit is formed in a peripheral region of the die pad DP, another problem regarding deterioration of heat dissipation properties of the semiconductor device arises.

As described above, the through hole DTH1 formed in the die pad DP of the semiconductor device PKG1 shown in FIG. 6 is a means in which damage to the bonding portion between the wire BW2 and the die pad DP is suppressed by suppressing deformation of the encapsulation body MR and die pad DP in a delaminated state. Thus, even if the opening length of the through hole DTH1 is not increased in the extending direction of the side DPs1 of the die pad DP, damage to the bonding portion can be suppressed. As shown in FIG. 6, the opening area of each of the plurality of through holes DTH1 is smaller than the area of the metal film MF2 covering the wire-bonding region WBR (less than half in the example shown in FIG. 6). Thus, deterioration of heat dissipation properties can be suppressed as compared to the case where the above-described slit is formed. In addition, it is preferable that the number of through holes DTH1 is small from the viewpoint of improving heat dissipation properties.

Figure 12:
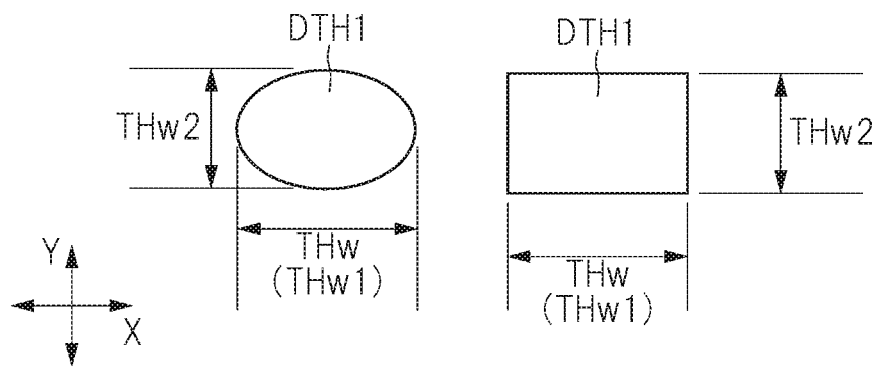
FIG. 12 is an enlarged plan view showing modification examples of an opening shape of a through hole shown in FIG. 6.

For example, in the example shown in FIG. 6, two through holes DTH1 are formed in one wire-bonding region WBR. Each of the two through holes DTH1 overlaps the metal film MF2. In addition, the adjacent through holes DTH1 are spaced apart from each other. In other words, a region in which no through hole DTH1 is formed is present between the two through holes DTH1. A separation distance between the adjacent through holes DTH1 is larger than the opening width THw of the through hole DTH1. In this case, the opening width THw of the through hole DTH1 is defined as the longest length of the opening shape of the through hole DTH1 in plan view. For example, in the case of the example shown in FIG. 6, the opening shape of the through hole DTH1 is circular in plan view, so that the opening width THw of the through hole DTH1 is defined as the diameter of the circle. In addition, in the case where the opening length (opening width THw1) in the X direction and the opening length (opening width THw2) in the Y direction orthogonal to the X direction differ from each other as in the modification examples shown in FIG. 12, the opening width of the through hole DTH1 is defined as the relatively longer opening width THw1. For example, in the case where the opening shape of the through hole DTH1 is elliptical, the opening width THw of the through hole DTH1 is defined as the longer diameter (opening width THw1) of the ellipse. In addition, in the case where the opening shape of the through hole DTH1 is rectangular, the opening width THw of the through hole DTH1 is defined as a length (opening width THw1) of a long side of the rectangle. FIG. 12 is an enlarged plan view showing modification examples of the opening shape of the through hole shown in FIG. 6.

In the case where the plurality of through holes DTH1 are formed in the vicinity of one wire-bonding region WBR (inside or in the periphery of the wire-bonding region WBR) as in the semiconductor device PKG1, force applied to the portion MR3 of the encapsulation body MR shown in FIG. 7 is dispersed. As a result, the portion MR3 is less likely to be destroyed. In addition, in the case of the semiconductor device PKG1, the through hole DTH1 is formed with a small opening width, so that heat is transmitted from between the adjacent through holes DTH1. As a result, the heat dissipation path can be provided from the die pad DP to the plurality of leads LD.

As described above, it is preferable that the opening width THw of the through hole DTH1 shown in FIG. 6 is small from the viewpoint of improving heat dissipation properties in the heat dissipation path from the die pad DP to the plurality of leads LD. However, when considering destruction strength of the portion MR3 of the encapsulation body MR shown in FIG. 7, it is preferable that the opening width THw of the through hole DTH1 shown in FIG. 6 is large. In addition, the through hole DTH1 can be easily formed during the manufacturing process of the semiconductor device PKG1 if the opening width THw of the through hole DTH1 is large. In the case of the present embodiment shown in FIG. 6, the opening width THw of each of the plurality of through holes DTH1 is larger than a width LDw of the tip portion (portion covered by the metal film MF1) of each of the plurality of leads LD.

Figure 13:
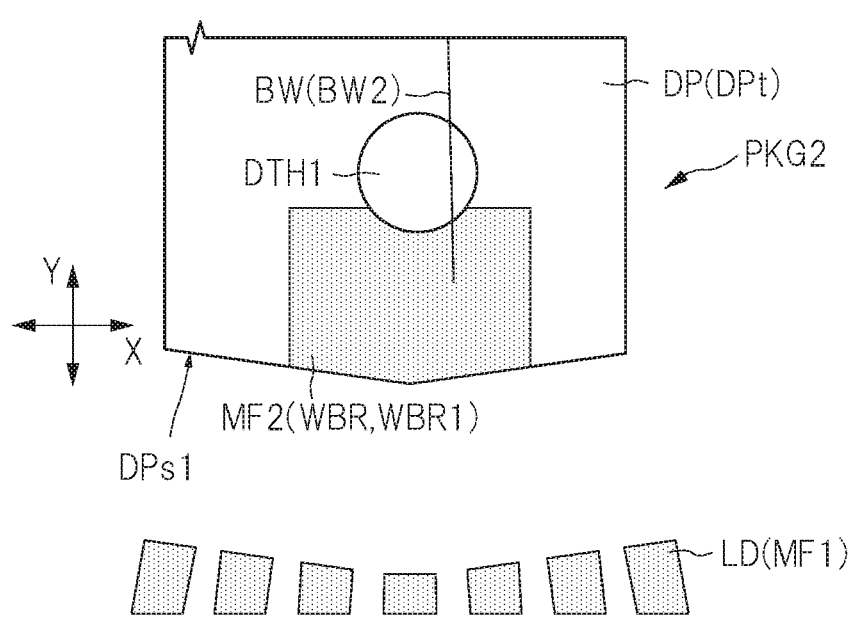
FIG. 13 is an enlarged plan view showing a modification example of FIG. 6.

In addition, as in the semiconductor device PKG2 shown in FIG. 13 which is a modification example of FIG. 6, there is an embodiment in which one through hole DTH1 is formed in the vicinity of one wire-bonding region (inside or in the periphery of the wire-bonding region WBR). FIG. 13 is an enlarged plan view showing a modification example of FIG. 6. The semiconductor device PKG2 shown in FIG. 13 differs from the semiconductor device PKG1 shown in FIG. 6 in that only one through hole DTH1 is formed at a position overlapping one wire-bonding region WBR1 (position overlapping the metal film MF2). Other configurations are the same as those of the semiconductor device PKG1. In the case of the semiconductor device PKG2, heat dissipation properties of the heat dissipation path from the die pad DP to the plurality of leads LD is further improved as compared to the semiconductor device PKG1 shown in FIG. 6. However, as the number of through holes DTH1 decreases, the force applied to the portion MR3 of the encapsulation body MR shown in FIG. 7 increases. Thus, it is preferable that the plurality of through holes DTH1 are formed in one wire-bonding region WBR as shown in FIG. 6 from the viewpoint of durability of the portion MR3 (that is, from the viewpoint of suppressing destruction of the portion MR3).

In addition, as another modification example associated with the position of the through hole DTH1, there is an embodiment such as a semiconductor device PKG3 shown in FIG. 14. FIG. 14 is an enlarged plan view showing another modification example of FIG. 6. The semiconductor device PKG3 shown in FIG. 14 differs from the semiconductor device PKG1 shown in FIG. 6 in that only one through hole DTH1 is formed at a position overlapping one wire-bonding region WBR1 (position overlapping the metal film MF2). In addition, the semiconductor device PKG3 shown in FIG. 14 differs from the semiconductor device PKG1 shown in FIG. 6 in that the entire through hole DTH1 overlaps the metal film MF2 in plan view. In the case of the semiconductor device PKG3, the entire through hole DTH1 overlaps the metal film MF2. In other words, the through hole DTH1 formed in the die pad DP of the semiconductor device PKG3 is present inside the wire-bonding region WBR in plan view and is not outside (is in the periphery) of the wire-bonding region WBR. In this manner, in the case where the entire through hole DTH1 overlaps the metal film MF2, the separation distance between the bonding portion of the wire BW2 and the through hole DTH1 can be shortened. In this case, an effect to suppress damage to the bonding portion of the wire BW2 caused by suppressing the large movement of the encapsulation body MR and die pad DP is relatively more effective than in the case of the semiconductor device PKG1 shown in FIG. 6.

Although not shown, as a modification example of the semiconductor device PKG3, there is also an embodiment in which the plurality of through holes DTH1 are formed inside the wire-bonding region WBR. However, in the case where the entire through hole DTH1 overlaps the metal film MF2, a space in which the wire BW2 can be bonded is reduced. In addition, when an area of the metal film MF2 is increased in order to provide sufficient space in which the wire BW2 can be bonded, delamination is likely to occur between the encapsulation body MR and the die pad DP shown in FIG. 7. Therefore, as in the semiconductor device PKG1 shown in FIG. 6 and the semiconductor device PKG2 shown in FIG. 13, it is preferable that a portion of the through hole DTH1 is located at a position not overlapping the metal film MF2 from the viewpoint of providing sufficient space in which the wire BW2 can be bonded. In addition, as in the semiconductor device PKG1 shown in FIG. 6, it is preferable that a portion of the through hole DTH1 is located at a position overlapping the metal film MF2 while another portion of the through hole DTH1 is located at a position not overlapping the metal film MF2.

Figure 15:
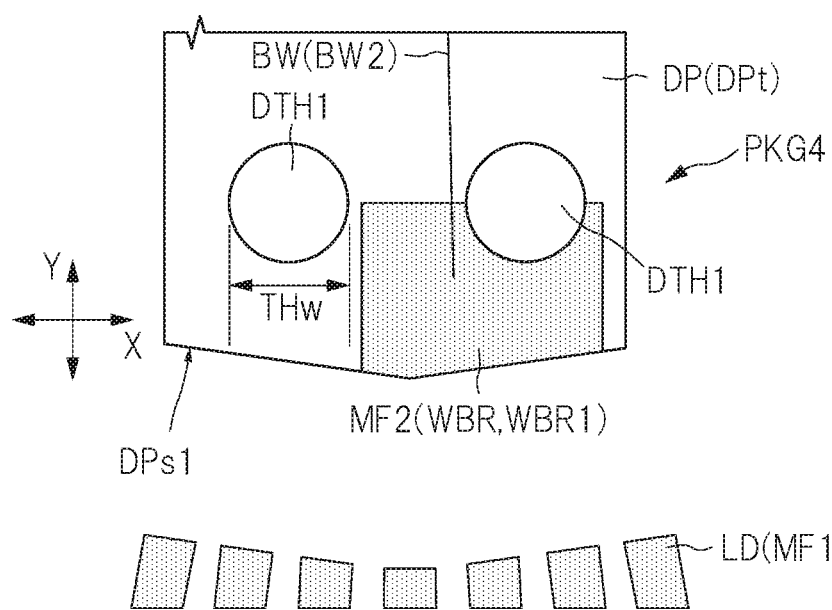
FIG. 15 is an enlarged plan view showing another modification example of FIG. 6.

In addition to the example shown in FIG. 6, there are various modification examples regarding the embodiment in which the plurality of through holes DTH1 are formed in or around one wire-bonding region WBR. FIG. 15 is an enlarged plan view showing another modification example of FIG. 6. A semiconductor device PKG4 shown in FIG. 15 differs from the semiconductor device PKG1 shown in FIG. 6 in that some of the plurality of through holes DTH1 are formed at positions not overlapping the metal film MF2. Other configurations are the same as those of the semiconductor device PKG1. In the case of the semiconductor device PKG4, one through hole DTH1 among the two through holes DTH1 in the vicinity of the wire-bonding region WBR1 overlaps the metal film MF2 while the other through hole DTH1 does not overlap the metal film MF2. When considering position tolerance at the time of forming the metal film MF2 or the through hole DTH1 over or in the die pad DP, there may be a case where some of the plurality of through holes DTH1 do not overlap the metal film MF2 as in the semiconductor device PKG4.

In the case of the semiconductor device PKG4, the wire BW2 is bonded onto the metal film MF2, so that bonding strength between the wire BW2 and the die pad DP is approximately the same as that of the semiconductor device PKG1. In addition, the effect to suppress damage to the bonding portion of the wire BW2 caused by suppressing the large movement of the encapsulation body MR and die pad DP increases as the distance between the position to which the wire BW2 is bonded and the plurality of through holes DTH1 decreases. Therefore, as shown in FIG. 15, in the case where the separation distance between the metal film MF2 and the through hole DTH1 not overlapping the metal film MF2 is short (for example, is within the tolerance at the time of forming the metal film MF2), the above-described effects can be considered to be approximately the same between the semiconductor device PKG4 and the semiconductor device PKG1.

In addition, since it is preferable that the through hole DTH1 is formed in the vicinity of the bonding portion of the wire BW2, it is preferable that at least one or more through holes DTH1 are formed at positions overlapping the metal film MF2 in plan view as shown in FIG. 15. Further, it is preferable that the separation distance between the metal film MF2 and the through hole DTH1 not overlapping the metal film MF2 is smaller than the opening width THw of the through hole DTH1.

In addition, in the case of the semiconductor device PKG1 shown in FIG. 6, the plurality of through holes DTH1 are arranged along the peripheral portion of the metal film MF2 in plan view. The bonding portion between the wire BW2 and the die pad DP (specifically, the metal film MF2) is bonded in a region surrounded by the plurality of through holes DTH1 and the peripheral portion of the die pad DP. In this case, the portion MR3 of the encapsulation body MR shown in FIG. 7 formed in the periphery of the bonding portion of the wire BW2 is fixed onto the die pad DP by the portion MR3 and a portion MR4 formed outside the die pad DP in plan view. Therefore, force applied to the bonding portion of the wire BW2 can be suppressed.

In addition, as shown in FIG. 5, the width of the metal film MF2 in the wire-bonding region WBR1 in a direction along the extending direction of the side DPs1 of the die pad DP is smaller than the separation distance between the metal film MF2 in the wire-bonding region WBR1 and the metal film MF2 in the wire-bonding region WBR2. In the semiconductor device PKG1, the width of the metal film MF2 is reduced, so that a region which is the starting point of delamination is reduced.

However, when considering position tolerance at the time of forming the metal film MF2 or the through hole DTH1, it is necessary to increase the area of the metal film MF2 in the wire-bonding region WBR1 to a certain degree in order to provide sufficient space in which the wire BW2 is to be bonded. In addition, as in the wire-bonding region WBR2 shown in FIG. 5, there may be a case where the plurality of wires BW are bonded to one metal film MF2. In the example shown in FIG. 6, one wire BW is bonded to one metal film MF2. However, the plurality of wires BW may be bonded to one metal film MF2. In the case where the plurality of wires BW are bonded to one metal film MF2, it is preferable that the area of the metal film MF2 is large.

In the case of the semiconductor device PKG1 shown in FIG. 6, the width MFw of the metal film MF2 in the wire-bonding region WBR1 is larger than the width LDw of the tip portion of each of the plurality of leads LD in the extending direction of the side DPs1 of the die pad DP. The same goes for the cases of the semiconductor device PKG2 shown in FIG. 13, the semiconductor device PKG3 shown in FIG. 14 and the semiconductor device PKG4 shown in FIG. 15.

In addition, as shown in FIG. 7, an inner wall of the through hole DTH1 is covered by the metal film MF2. As will be described in detail below, in the manufacturing process of the semiconductor device PKG1, the metal film MF2 is formed after forming the through hole DTH1 in the die pad DP. The metal film MF2 is formed by, for example, the plating method. Specifically, a plating mask PM (see FIG. 18 described below) is formed over the wire-bonding region WBR of the die pad DP, and the metal film MF2 is selectively formed over the top surface DPt of the die pad DP at a position overlapping an opening PMT (see FIG. 18 described below) of the plating mask PM. In the case where the metal film MF2 is formed after forming the through hole DTH1, the plurality of through holes DTH1 can be formed at once at the time of forming a pattern of the lead frame. In this case, the manufacturing process can be simplified as compared to the case where the through hole DTH1 is formed after forming the metal film MF2, so that manufacturing efficiency is improved.

In the case where a plating process is performed in a state in which the opening PMT (see FIG. 18 described below) of the plating mask PM (see FIG. 18 described below) used at the time of forming the metal film MF2 overlaps the through hole DTH1, the metal film MF2 is formed over a portion of the inner wall of the through hole DTH1 overlapping the plating mask PM. In the example shown in FIG. 7, the metal film MF2 is formed in a state in which a portion of the through hole DTH1 overlaps the plating mask PM while another portion of the through hole DTH1 does not overlap the plating mask PM. Thus, the inner wall of the through hole DTH1 is covered by the metal film MF2.

Manufacturing Method

Figure 16:
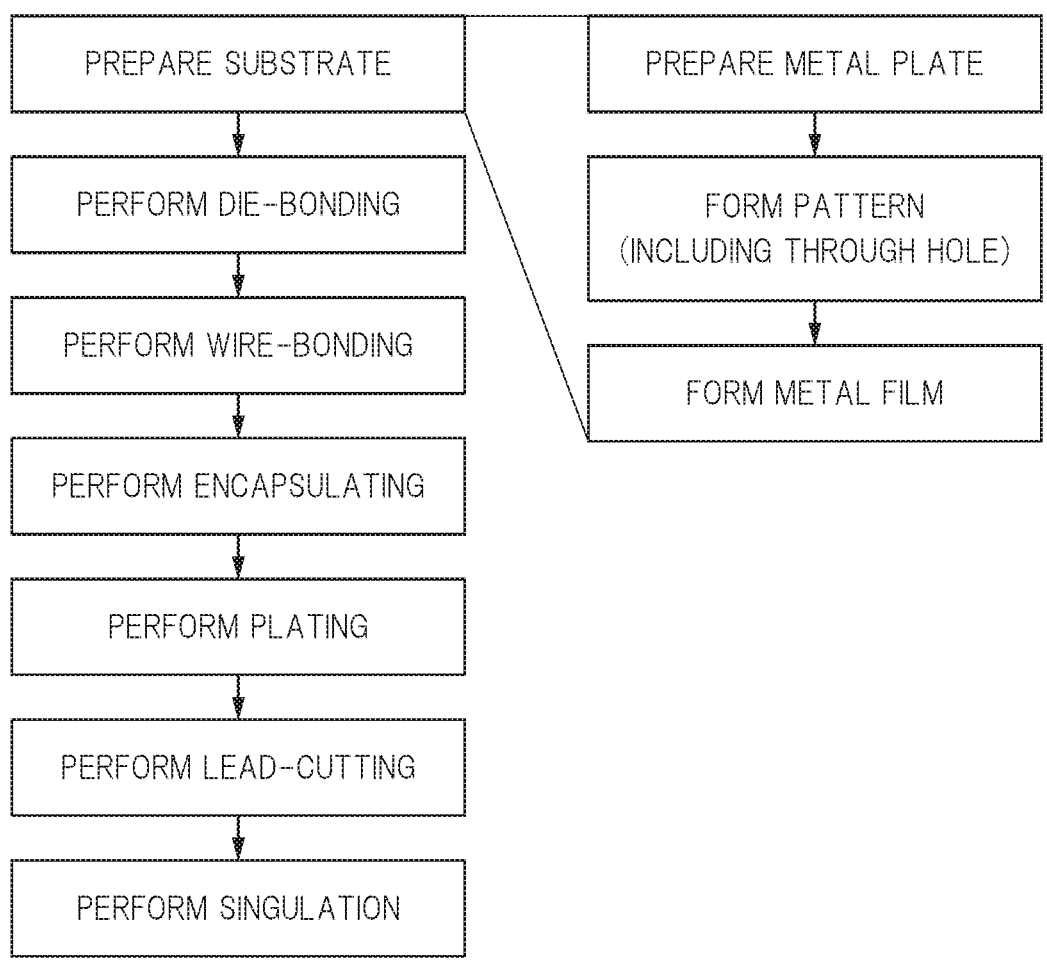
FIG. 16 is an explanatory diagram showing a flow of an assembly process of the semiconductor device described with reference to FIGS. 1 to 8.

Next, a manufacturing method of the semiconductor device PKG1 shown in FIG. 1 will be described. FIG. 16 is an explanatory diagram showing a flow of an assembly process of the semiconductor device described with reference to FIGS. 1 to 8. FIG. 16 shows main steps in the manufacturing process of the semiconductor device PKG1 shown in FIG. 1. However, various modification examples besides the assembly flow shown in FIG. 16 can be applied. For example, although FIG. 16 does not include a step of marking in which a product identification mark is formed on the encapsulation body MR (see FIG. 1), this step may be added between a step of encapsulating and a step of plating. In addition, although FIG. 16 does not include a step of testing, this step may be added, for example, after a step of singulation or the like.

Step of Preparing Substrate

Figure 17:
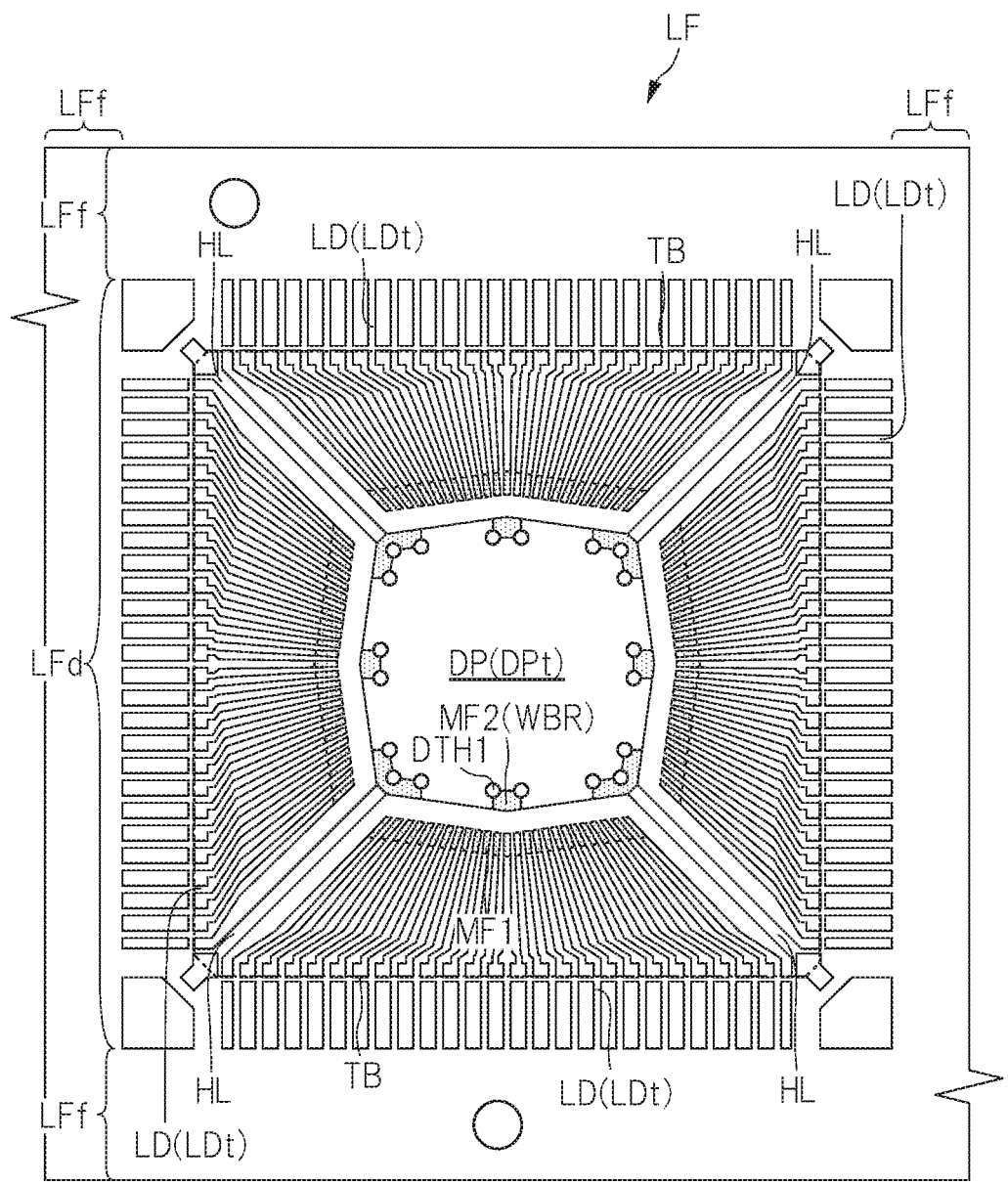
FIG. 17 is an enlarged plan view showing a lead frame prepared in a step of preparing a substrate shown in FIG. 16.
Figure 18:
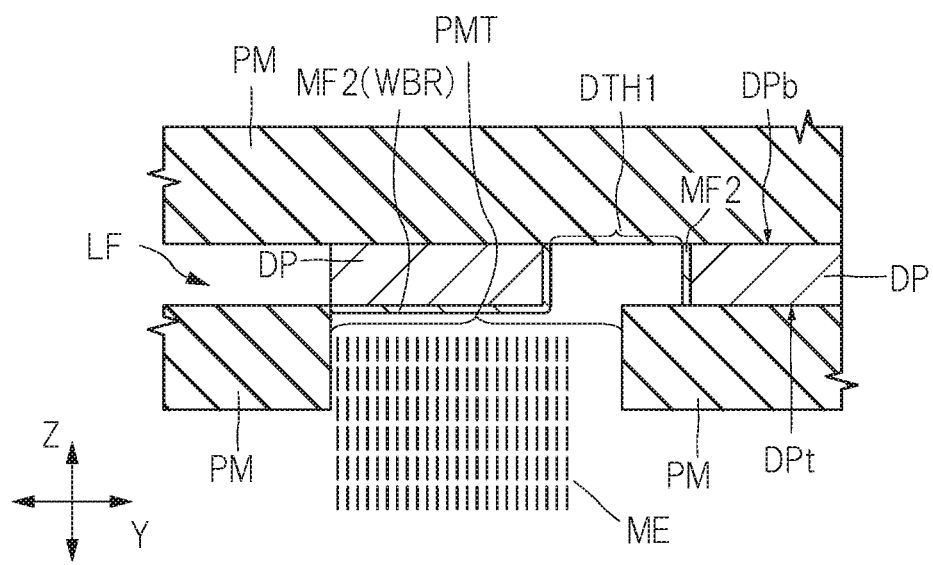
FIG. 18 is an enlarged cross-sectional view schematically showing a manner to which a metal film is partially formed over a die pad shown in FIG. 17 by an electrolytic plating method.

In a step of preparing a substrate shown in FIG. 16, the lead frame LF shown in FIG. 17 is prepared. FIG. 17 is an enlarged plan view showing the lead frame prepared in the step of preparing a substrate shown in FIG. 16. FIG. 18 is an enlarged cross-sectional view schematically showing a manner to which the metal film is partially formed over the die pad shown in FIG. 17 by the electrolytic plating method.

The lead frame LF prepared in this step comprises a plurality of device forming portions LFd inside the frame portion LFf. Although the lead frame LF is a substrate comprising the plurality of device forming portions LFd, FIG. 17 shows an enlarged view of one of the device forming portions LFd for the sake of clarity. The lead frame LF is made of metal and, in the present embodiment, is made of metal containing, for example, copper (Cu) as a main component.

In addition, as shown in FIG. 17, the die pad DP serving as the chip mounting portion is formed at a center portion of the device forming portion LFd. Each of the plurality of suspension leads HL is connected to the die pad DP and is arranged so as to extend to a corner portion of the device forming portion LFd. Namely, the die pad DP is supported by the suspension leads HL as well as being supported by the frame portion LFf of the lead frame LF via the suspension leads HL.

In addition, the plurality of leads LD are formed around the die pad DP and between the corresponding suspension leads HL. Each of the plurality of leads LD is connected to the frame portion LFf.

In addition, each of the plurality of leads LD is connected to one another via a tie bar TB. The tie bar TB functions as a dam member for suppressing leakage of resin during the step of encapsulating shown in FIG. 16 in addition to functioning as a connecting member for connecting the plurality of leads LD to one another. The tie bar TB is connected to the plurality of leads LD and the frame portion LFf of the lead frame LF. In addition, one end of each of the plurality of leads LD is connected to the frame portion LFf of the lead frame LF. Thus, each of the plurality of leads LD is supported by the frame portion LFf of the lead frame LF until a step of lead-cutting shown in FIG. 16.

In addition, the die pad DP and the leads LD of the lead frame LF prepared in this step has a structure as described above with reference to FIGS. 5 to 7. Namely, the metal film MF1 is formed over the top surface LDt of the tip portion of each of the plurality of leads LD. The metal film MF2 partially covering the top surface DPt of the die pad DP is formed over the plurality of wire-bonding regions WBR of the die pad DP. In addition, the through hole DTH1 penetrating through the die pad DP from the top surface DPt to the bottom surface DPb (see FIG. 7) is formed in the die pad DP. The through hole DTH1 is formed at a position overlapping the metal film MF2. In the example shown in FIG. 17, the die pad DP comprises eight wire-bonding regions WBR, and each of the wire-bonding regions WBR is covered by the metal film MF2. In addition, the plurality of through holes DTH1 are formed in each of the wire-bonding regions WBR.

The lead frame shown in FIG. 17 is manufactured, for example, in the following manner. First, as shown in FIG. 16, a metal plate serving as a base of the lead frame is prepared as a step of preparing a metal plate in the step of preparing a substrate. The metal plate is made of metal containing copper as a main component. The metal plate is formed by rolling a metal material.

In addition, after the step of preparing a metal plate, the step of preparing a substrate includes a step of forming a pattern in which the metal plate is processed to form a metal pattern as shown in FIG. 17. In the step of forming a pattern, a cutting process in which the plurality of leads LD, the die pad DP and the like are cut into shapes as shown in FIG. 17 is performed. In addition, in the step of forming a pattern, a hole forming process in which the plurality of through holes DTH1 are formed in the die pad DP is performed. For the cutting process, it is possible to use, for example, a method in which the metal plate is pressed while being sandwiched between a punch and a die or a method in which unnecessary portions are removed by etching. For the hole forming process in which the through hole DTH1 is formed, it is possible to use a method in which the metal plate is drilled in addition to the above-described method in which the metal plate is pressed by the punch and the die or in which the metal plate is etched.

In addition, after the step of forming a pattern, the step of preparing a substrate includes a step of forming a metal film in which the metal film MF2 is formed over the top surface DPt of the die pad DP. In the step of forming a metal film, the metal film MF1 is formed in addition to the plurality of metal films MF2 shown in FIG. 17.

In the step of forming a metal film, the metal film MF1 and the metal film MF2 shown in FIG. 17 are formed by, for example, the electrolytic plating method. In the example shown in FIG. 18, the plating mask PM is adhered to each of the top surface DPt and bottom surface DPb of the die pad DP by the electrolytic plating method in the step of forming a metal film. The opening (through hole) PMT is formed in the plating mask PM formed over the top surface DPt of the die pad DP. The plating mask PM is formed such that the wire-bonding region WBR and the opening PMT overlap each other on the top surface DPt of the die pad DP. In addition, in the step of forming a metal film, an electrolyte solution ME is sprayed toward the top surface DPt of the die pad DP in a state in which the top surface DPt and the bottom surface DPb of the die pad DP are flipped over. At this time, the electrolyte solution ME is spayed while a current is flowed in the lead frame LF, so that metal is deposited on a portion of the lead frame LF (die pad DP) exposed through the plating mask PM to selectively form the plating film (metal film MF2).

In the case where a portion of the through hole DTH1 overlaps the opening PMT of the plating mask PM as in the present embodiment, the metal film MF2 is also formed over the inner wall of the through hole DTH1. As shown in FIG. 18, in the case where the through hole DTH1 and the opening PMT of the plating mask PM are communicating with each other, the entire inner wall of the through hole DTH1 is covered by the metal film MF2. However, if a portion of the through hole DTH1 overlaps the opening PMT while another portion of the through hole DTH1 does not overlap the opening PMT, there may be a case where the metal film MF2 is not formed over the portion of the inner wall of the through hole DTH1 not overlapping the opening PMT.

The electrolytic plating method shown in FIG. 18 is an example of a step of forming the metal film MF2 by the plating method, and various modification examples can be applied to the present invention. However, in order to form the metal film MF2 over the inner wall of the through hole DTH1, the through hole DTH1 needs to be formed before forming the metal film MF2. In the case where the through hole DTH1 is formed before forming the metal film MF2, it is not necessary to consider damage to the metal film MF2 or occurrence of delamination at the time of forming the through hole DTH1. Namely, the manufacturing process can be simplified, so that manufacturing efficiency is improved.

The plurality of metal films MF2 shown in FIG. 17 can be formed at once. In addition, each of the plurality of metal films MF1 at the tip portion of the lead LD may be formed at once at the time of forming the metal film MF2.

In addition, although not shown in FIG. 16, the step of preparing a substrate includes a step of bending in which a portion (offset portion HLB shown in FIG. 4) of the suspension lead is bent to offset a position of the die pad DP. The step of bending can be performed after the step of forming a pattern or after the step of forming a metal film shown in FIG. 16.

Step of Die-Bonding

Figure 19:
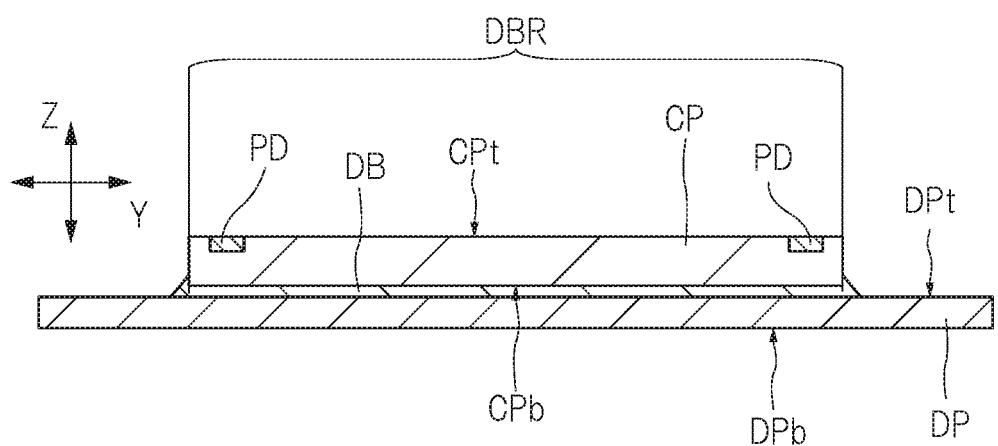
FIG. 19 is an enlarged cross-sectional view showing a state in which a semiconductor chip is mounted on a die pad of a lead frame shown in FIG. 17.

Next, in a step of die-bonding (step of mounting a semiconductor chip) shown in FIG. 16, the semiconductor chip CP is mounted on the die pad DP as shown in FIG. 19. FIG. 19 is an enlarged cross-sectional view showing a state in which the semiconductor chip is mounted on the die pad of the lead frame shown in FIG. 17.

The semiconductor chip CP includes the front surface CPt, the rear surface CPb located opposite to the front surface CPt, and the plurality of pads PD arranged on the front surface CPt. In this step, the semiconductor chip CP is mounted on the die-bonding region DBR on the top surface DPt of the die pad DP such that the rear surface CPb of the semiconductor chip CP and the top surface DPt of the die pad DP face each other. The semiconductor chip CP is fixed onto the die pad DP via the die-bonding member DB formed between the semiconductor chip CP and the die pad DP. The die-bonding member DB uses, for example, a resin adhesive having an epoxy-based thermosetting resin containing metal particles such as silver, or a metal bonding member such as a solder member. As a modification example of the die-bonding member DB, a resin adhesive not containing a metal material may be used. However, it is preferable that the die-bonding member DB contains a metal material from the viewpoint of improving heat dissipation properties from the semiconductor chip CP to the die pad DP.

Step of Wire-Bonding

Figure 20:
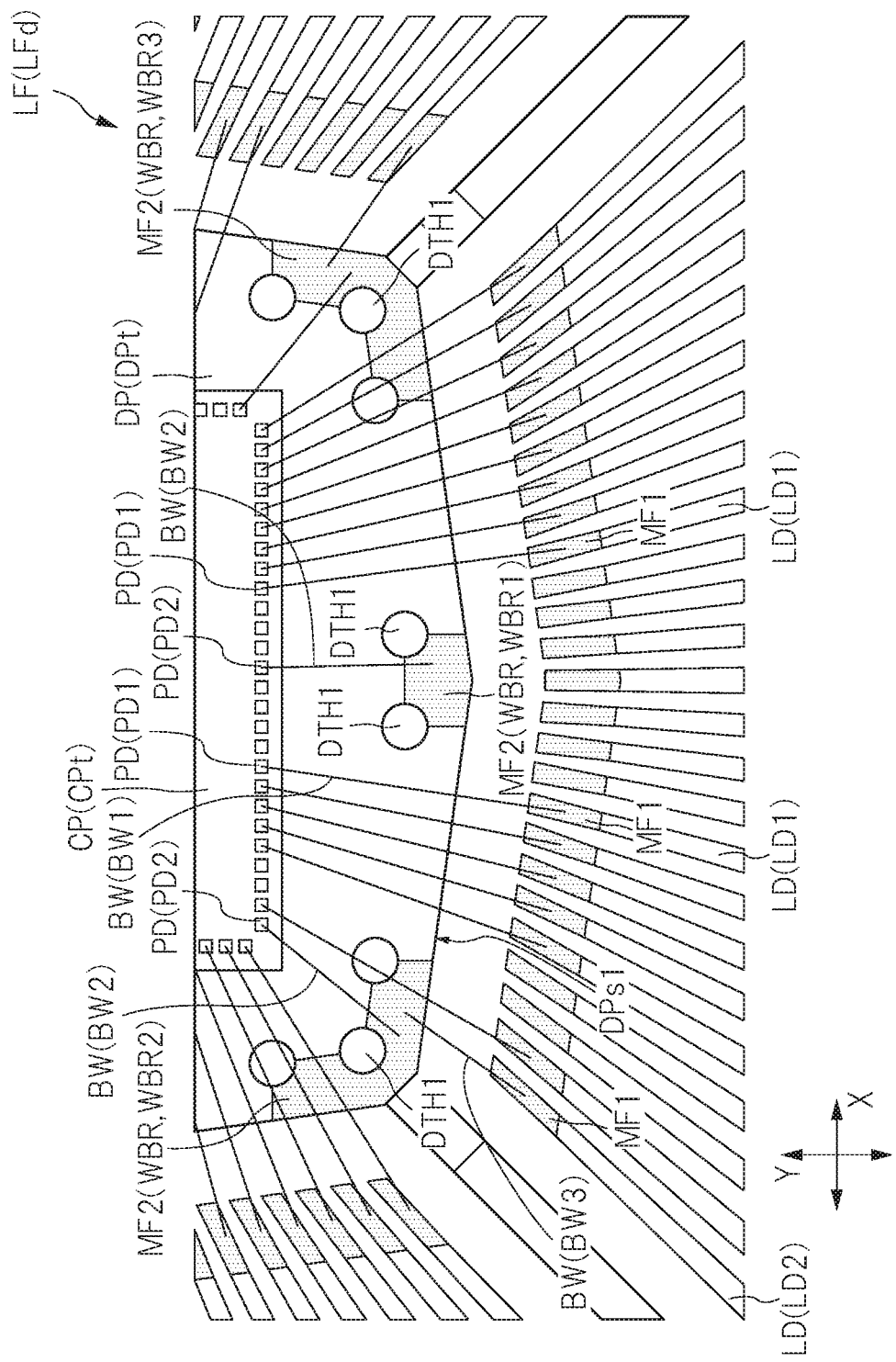
FIG. 20 is an enlarged plan view showing a state in which a semiconductor chip shown in FIG. 19 and a plurality of leads shown in FIG. 17 are electrically connected to each other via wires.

Next, in a step of wire-bonding shown in FIG. 16, each of the plurality of pads PD formed on the front surface CPt of the semiconductor chip CP is electrically connected to the die pad DP or the plurality of leads LD via the plurality of wires (conductive members) BW as shown in FIG. 20.

FIG. 20 is an enlarged plan view showing a state in which the semiconductor chip shown in FIG. 19 and the plurality of leads shown in FIG. 17 are electrically connected to each other via the wires. In FIG. 20, the number of wires BW is reduced for the sake of clarity.

The plurality of wires BW shown in FIG. 20 include the wire BW1 electrically connecting the pad PD of the semiconductor chip CP and the plurality of leads LD to each other. The wire BW1 has one end bonded to the pad PD1 of the semiconductor chip CP and the other end bonded to the wire-bonding region (portion covered by the metal film MF1) at the tip portion of the lead LD1. In addition, the plurality of wires BW include the wire BW2 electrically connecting the pad PD of the semiconductor chip CP and the die pad DP to each other. The wire BW2 has one end bonded to the pad PD2 of the semiconductor chip CP and the other end bonded to the wire-bonding region WBR (portion covered by the metal film MF2) of the die pad DP. Further, the plurality of wires BW include the wire BW3 electrically connecting the die pad DP and the lead LD to each other. The wire BW3 has one end bonded to the wire-bonding region WBR (portion covered by the metal film MF2) of the die pad DP and the other end bonded to the wire-bonding region (portion covered by the metal film MF1) at the tip portion of the lead LD2. There are various modification examples of the bonding method for the wire BW. For example, it is possible to use a bonding method in which a bonding tool (such as a bonding capillary) is utilized to apply heat and ultrasonic waves to the bonding portion of the wire BW, so that the wire BW is compression-bonded to the portion to be bonded (pad PD, metal film MF1 or metal film MF2).

In the case of the present embodiment, the plurality of metal films MF2 are partially formed over the top surface DPt of the die pad DP, so that the area of the metal film MF2 is reduced. However, the area of each of the plurality of metal films MF2 is larger than the opening area of each of the plurality of through holes DTH1. By increasing the area of the metal film MF2 to a certain degree, the wire BW2 and BW3 can be securely bonded.

Step of Encapsulating

Figure 21:
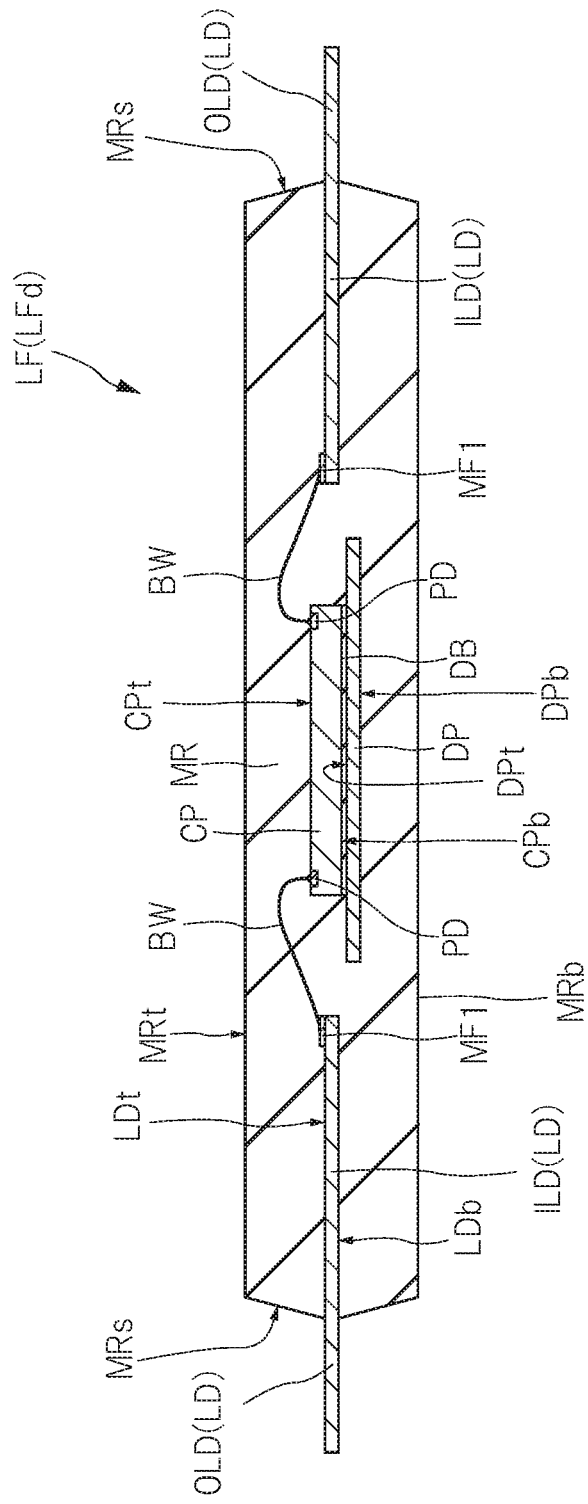
FIG. 21 is a cross-sectional view showing a state in which an encapsulation body encapsulating a semiconductor chip is formed in a device forming portion of the lead frame.
Figure 22:
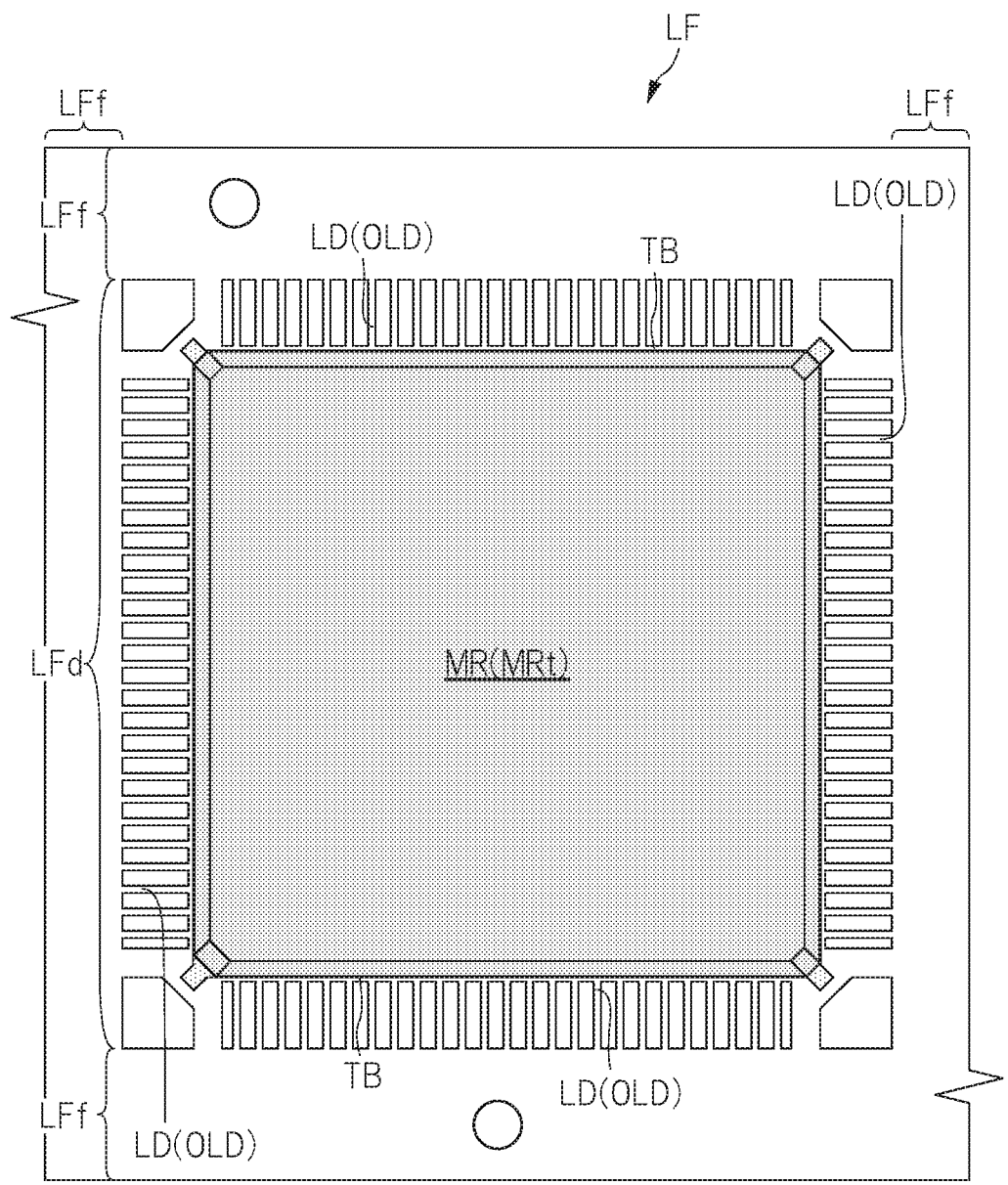
FIG. 22 is a plan view showing a state in which the encapsulation body encapsulating the semiconductor chip is formed in the device forming portion of the lead frame.
Figure 23:
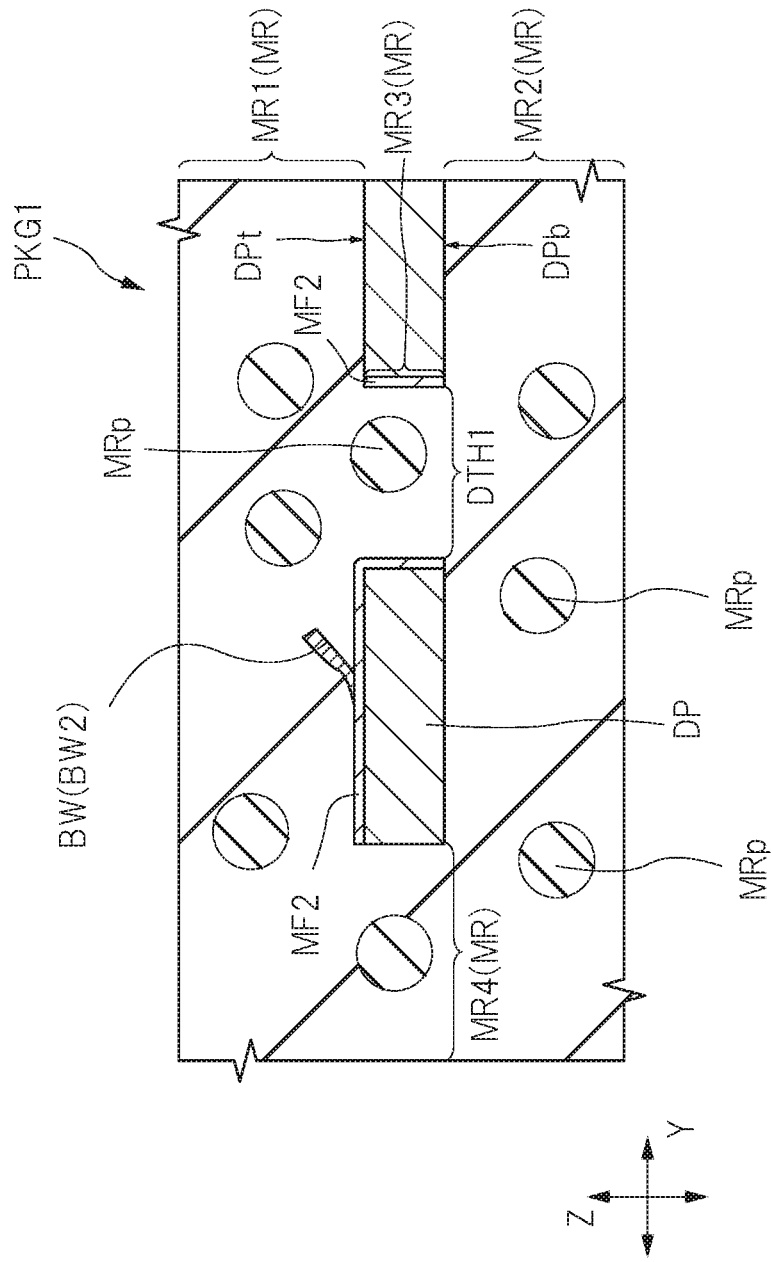
FIG. 23 is an enlarged cross-sectional view showing a portion along a through hole shown in FIG. 20.

Next, in the step of encapsulating shown in FIG. 16, the semiconductor chip CP, the plurality of wires BW and the die pad DP are encapsulated in resin to form the encapsulation body MR as shown in FIG. 21. FIG. 21 is a cross-sectional view showing a state in which the encapsulation body encapsulating the semiconductor chip is formed in the device forming portion of the lead frame. FIG. 22 is a plan view showing a state in which the encapsulation body encapsulating the semiconductor chip is formed in the device forming portion of the lead frame. In addition, FIG. 23 is an enlarged cross-sectional view showing a portion along the through hole shown in FIG. 20. FIG. 23 is a drawing showing the step of encapsulating in the manufacturing process of the semiconductor device PKG1 shown in FIG. 1. However, since filler particles MRp shown in FIG. 23 are also included in the finished encapsulation body MR, the encapsulation body shown in FIG. 23 is denoted as "PKG1".

In this step, the lead frame LF is positioned in a molding die having, for example, a cavity (not shown), resin is supplied to a space formed by the cavity, and thereafter, the resin is cured to form the encapsulation body (encapsulating portion) MR. Such a method of forming the encapsulation body MR is known as a "transfer molding process".

The encapsulation body MR is formed in a region surrounded by the tie bar TB of the device forming portion LFd in plan view. In addition, a portion of the resin having leaked out from the cavity is blocked by the tie bar TB. Thus, the outer lead portion OLD of each of the plurality of leads LD is exposed to the outside of the encapsulation body MR.

In addition, as schematically shown in FIG. 23, the encapsulation body MR includes a plurality of filler particles MRp mixed with resin. The filler particles MRp are made of, for example, silica (inorganic material containing silicon dioxide as a main component) or the like. By mixing the filler particles MRp into the encapsulation body MR, a difference between the linear expansion coefficient of the semiconductor chip CP and the linear expansion coefficient of the encapsulation body MR can be reduced. In the case of the present embodiment, the opening shape of the through hole DTH1 has a shape that allows the filler particles MRp to pass therethrough.

Specifically, the opening width of the through hole DTH1 is larger than a particle size of the filler particle MRp (diameter of the filler particle MRp when seen as a sphere). In addition, in the case where the opening length (opening width THw1) in the X direction and the opening length (opening width THw2) in the Y direction orthogonal to the X direction differ from each other as in the modification examples of the opening shape of the through hole DTH1 shown in FIG. 12, the particle size of the filler particle MRp is smaller than the relatively shorter opening width THw2. In the step of encapsulating, the filler particles MRp can be prevented from being clogged in the through hole DTH1. Thus, in the step of encapsulating, the material (resin and filler particles MRp) for the encapsulation body MR is buried inside the through hole DTH1 to form the portion MR3 described with reference to FIG. 7. In order to ensure that the filler particles MRp are not clogged in the through hole DTH1, it is particularly preferable that the opening width (opening width THw2 in the examples shown in FIG. 12) of the through hole DTH1 is at least twice the particle size of the filler particle MRp. FIG. 23 shows an example in which the filler particles MRp are disposed inside the through hole DTH1. However, the filler particles MRp do not necessarily need to be disposed inside the through hole DTH1.

The encapsulation body MR formed in this step includes the portion MR1 formed over the top surface DPt of the die pad DP, the portion MR2 formed under the bottom surface DPb of the die pad DP, and the portion MR3 buried in the through hole DTH1 of the die pad DP. The portion MR1 and the portion MR2 of the encapsulation body MR are connected to each other via the portion MR3.

Step of Plating

Next, in the step of plating shown in FIG. 16, the metal film MC (see FIG. 2) is formed over the exposed surface of each of the plurality of leads LD shown in FIG. 22 by the plating method. The metal film MC formed in this step is formed in order to improve wettability of the solder member used as a bonding member at the time of mounting the semiconductor device PKG1 on the mounting substrate (not shown).

In this step, it is preferable that the metal film MC made of solder is formed over the exposed surface of the lead LD. In addition, an electroplating method in which ionized metal ions are deposited on the exposed surface of the lead LD can be applied as a method of forming the metal film MC. The electroplating method is preferable in that film quality of the metal film MC can be easily controlled by controlling the current flowed at the time of forming the metal film MC. In addition, the electrolytic plating method is preferable in that a formation time of the metal film MC can be shortened.

Step of Lead-Cutting

Figure 24:
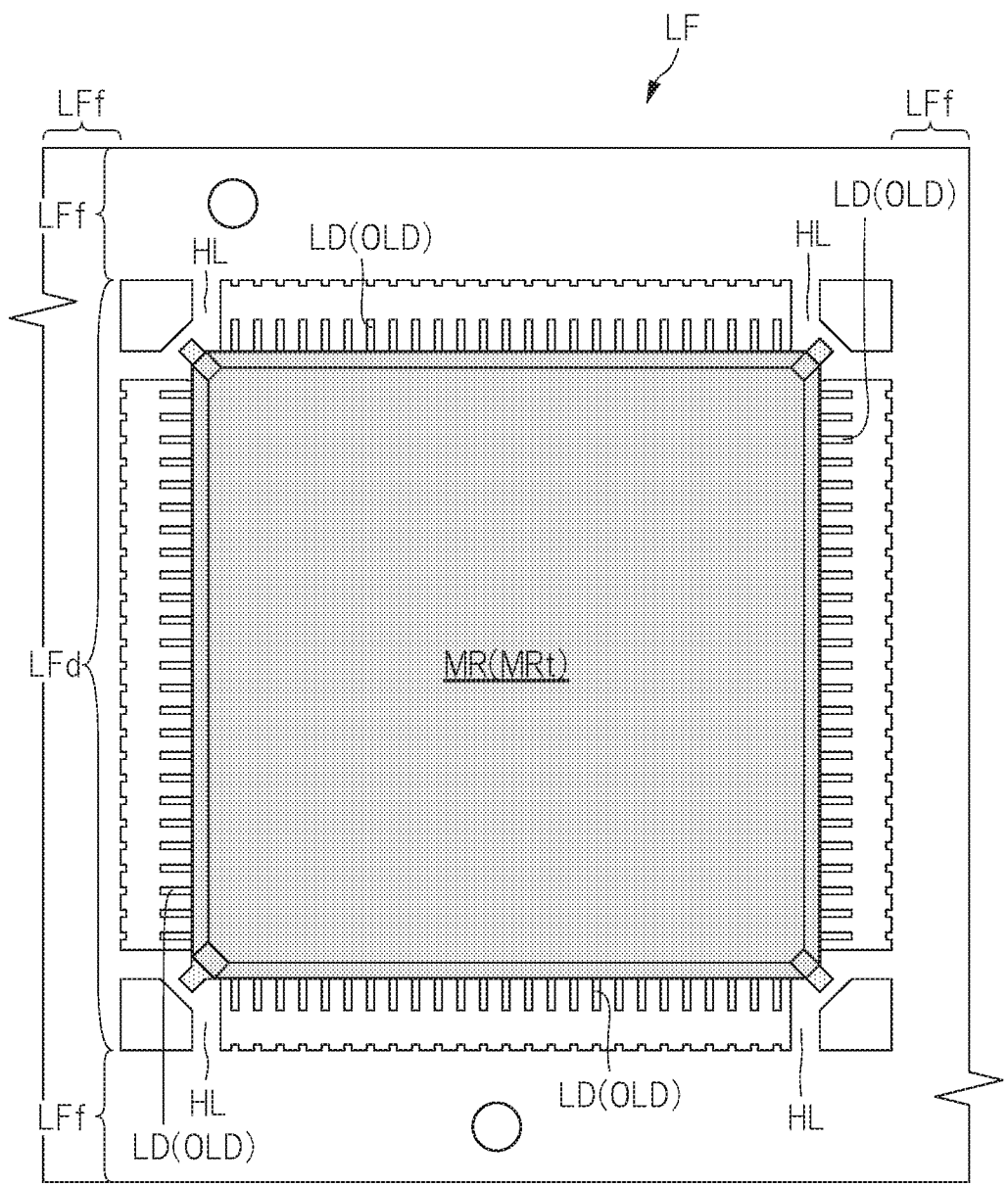
FIG. 24 is an enlarged plan view showing a state in which a metal film is formed over an exposed surface of each of the plurality of leads shown in FIG. 22 and in which each of the plurality of leads is cut and formed thereafter.

Next, in the step of lead-cutting shown in FIG. 16, the outer lead portion OLD of each of the plurality of leads LD is cut such that each of the plurality of leads LD is separated from the lead frame LF as shown in FIG. 24. In addition, in the present embodiment, after each of the plurality of leads LD is cut, each of the plurality of leads LD is bent to form the plurality of leads LD as shown in FIG. 2. FIG. 24 is an enlarged plan view showing a state in which the metal film is formed over the exposed surface of each of the plurality of leads shown in FIG. 22 and in which each of the plurality of leads is cut and formed thereafter.

In this step, the tie bar TB (see FIG. 22) connecting the plurality of leads LD to one another is cut. In addition, each of the plurality of leads LD is cut from the frame portion LFf. Thus, the plurality of leads LD become independent members separated from one another. In addition, after the plurality of leads LD are cut, the encapsulation body MR and the plurality of leads LD are supported by the frame portion LFf via the suspension leads HL (see FIG. 17).

The plurality of leads LD and the tie bar TB are cut by a press-working process using a die for cutting. In addition, the plurality of leads LD having been cut can be formed as shown in, for example, FIG. 2 by bending the outer lead portion OLD of each of the plurality of leads LD in a press-working process using, for example, a die (not shown) for forming the shape of the leads.

Step of Singulation

Figure 25:
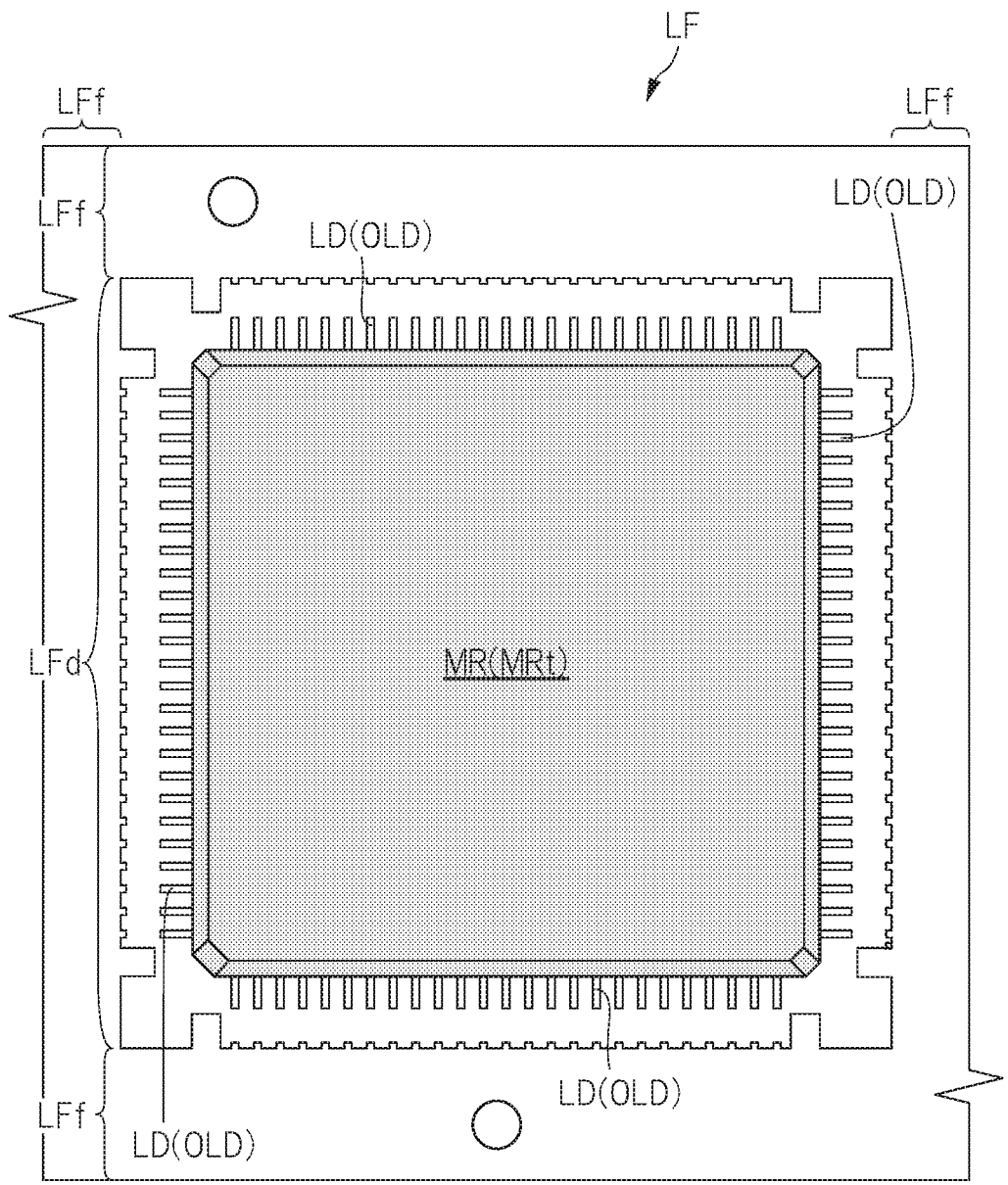
FIG. 25 is an enlarged plan view showing a state in which suspension leads shown in FIG. 24 are cut to obtain a semiconductor package.

Next, in the step of singulation shown in FIG. 16, each of the plurality of suspension leads HL is cut at the corresponding device forming portion LFd to separate the semiconductor package as shown in FIG. 25. FIG. 25 is an enlarged plan view showing a state in which the suspension leads shown in FIG. 24 are cut to obtain the semiconductor package.

In this step, the plurality of suspension leads HL and the residual resin at the corner portions of the encapsulation body MR shown in FIG. 24 are cut to obtain the semiconductor package (specifically, a test piece to be tested). The leads and the remaining resin can be cut by, for example, a press-working process using a die (not shown) for cutting as in the above-described step of lead-cutting.

After this step, necessary inspections and tests such as external visual inspection, electrical tests and the like are conducted, and the piece having passed the tests becomes the finished semiconductor device PKG1 shown in FIG. 1.

Next, representative modification examples of the embodiments described with reference to FIGS. 1 to 25 will be described. Several modification examples have been described above. Hereinafter, representative modification examples other than those described above will be described.

First Modification Example

Figure 26:
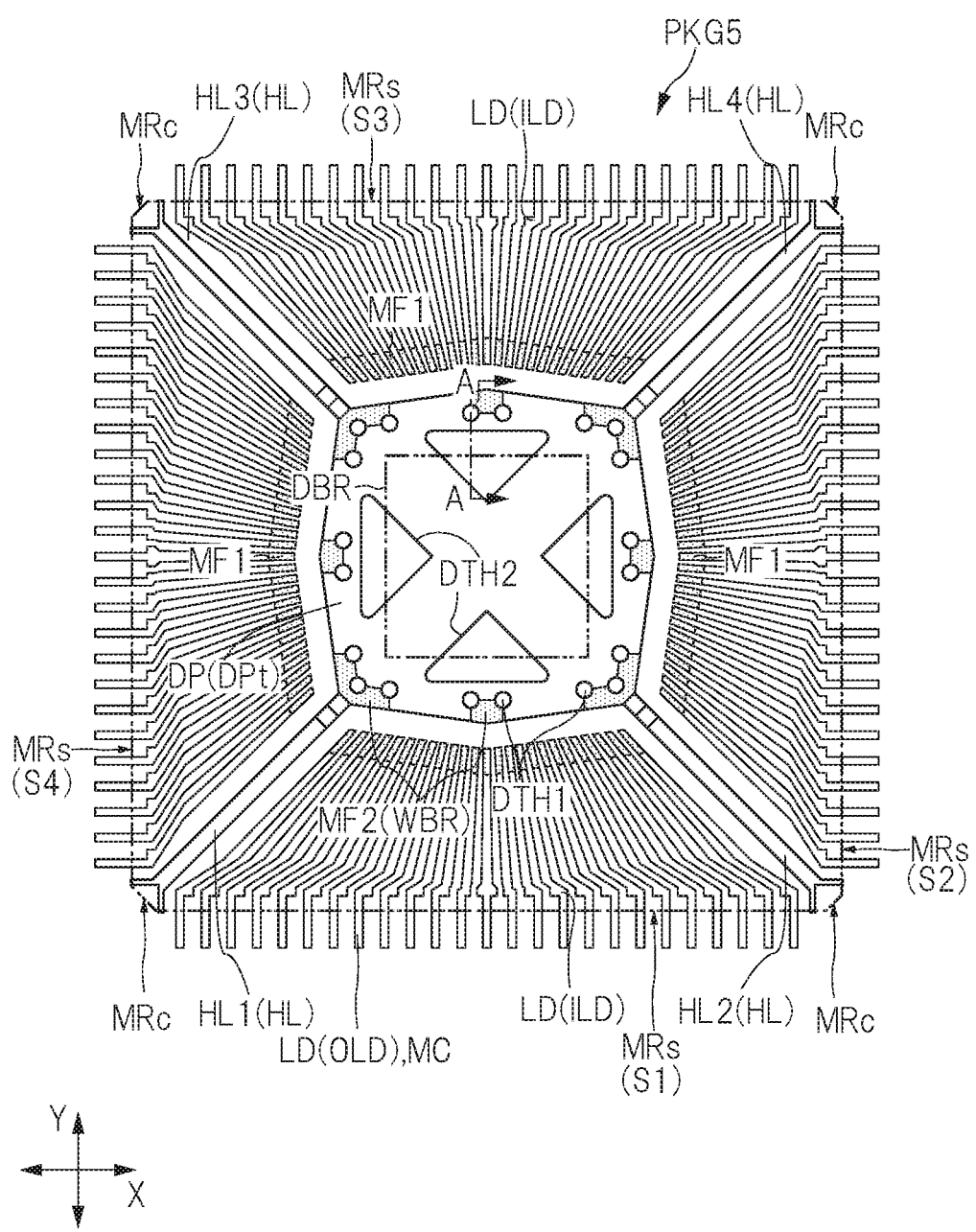
FIG. 26 is a plan view showing a state in which a semiconductor chip and a plurality of wires are removed from a semiconductor device which is a modification example of FIG. 4.
Figure 27:
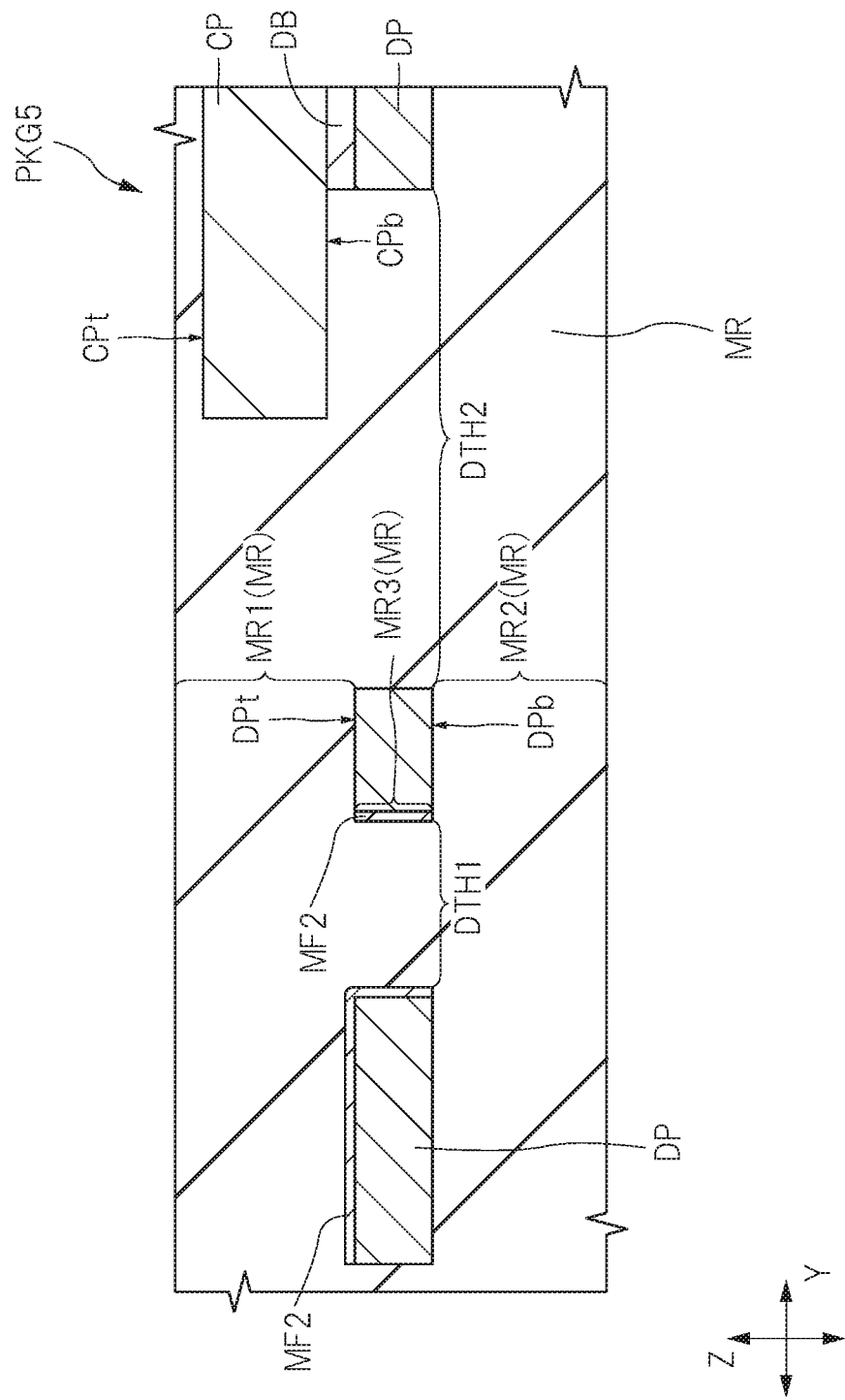
FIG. 27 is an enlarged cross-sectional view taken along a line A-A of FIG. 26.

In the case of the semiconductor device PKG1 shown in FIG. 4, the plurality of through holes DTH1 are formed in the periphery of the wire-bonding region WBR of the die pad DP. As a modification example of the semiconductor device PKG1, there may be a case where another through hole DTH2 that differs from the through hole DTH1 is formed in the die pad DP as in a semiconductor device PKG5 shown in FIG. 26. FIG. 26 is a plan view showing a state in which the semiconductor chip and the plurality of wires are removed from the semiconductor device which is a modification example of FIG. 4. In addition, FIG. 27 is an enlarged cross-sectional view taken along a line A-A of FIG. 26. FIG. 27 also shows the semiconductor chip CP not shown in FIG. 26.

The semiconductor device PKG5 shown in FIG. 26 differs from the semiconductor device PKG1 shown in FIG. 4 in that a plurality of through holes DTH2 are formed in the die pad DP in addition to the plurality of through holes DTH1. The through hole DTH2 formed in the die pad DP of the semiconductor device PKG5 penetrates through the die pad DP from the top surface DPt to the bottom surface DPb. In addition, the through hole DTH2 overlaps the die-bonding region DBR in plan view. In other words, as shown in FIG. 27, the through hole DTH2 and the semiconductor chip CP overlap each other in the thickness direction of the semiconductor chip CP.

In the case where the through hole DTH2 is formed at a position overlapping the semiconductor chip CP, a portion of the rear surface CPb of the semiconductor chip CP (a portion formed at a position overlapping the through hole DTH2) is adhered to the encapsulation body MR. Although not shown in FIG. 27, the encapsulation body MR of the semiconductor device PKG5 shown in FIG. 27 includes the plurality of filler particles MRp described with reference to FIG. 23. The difference between the linear expansion coefficient of the encapsulation body MR and the linear expansion coefficient of the semiconductor chip CP is smaller than the difference between the linear expansion coefficient of the encapsulation body MR and the linear expansion coefficient of the die pad DP. Thus, delamination is less likely to occur in the adhesive interface between the encapsulation body MR and the semiconductor chip CP as compared to the adhesive interface between the encapsulation body MR and the die pad DP.

In addition, as shown in FIG. 26, the opening area of each of the plurality of through holes DTH1 is smaller than an opening area of each of the plurality of through holes DTH2. In other words, the opening area of each of the plurality of through holes DTH2 is larger than the opening area of each of the plurality of through holes DTH1. As the opening area of the through hole DTH2 increases, an area of the portion of the rear surface CPb of the semiconductor chip CP shown in FIG. 27 to which the encapsulation body MR is adhered increases. In this case, delamination is less likely to occur between the die pad DP and the encapsulation body MR in the periphery of the semiconductor chip CP.

As described above with reference to FIG. 7, even in the case where delamination occurs between the encapsulation body MR and the metal film MF2 of the die pad DP, the through hole DTH1 suppresses damage to the bonding portion of the wire BW2 by reducing the stress applied to the bonding portion between the wire BW2 and the die pad DP. In addition, by suppressing the die pad DP and the encapsulation body MR from moving in different directions from each other, progress of delamination can be suppressed to some extent. However, it would be difficult to completely stop the progress of delamination occurring between the die pad DP and the encapsulation body MR.

When delamination occurring between the die pad DP and the encapsulation body MR progresses to the die-bonding region DBR shown in FIG. 26, the die-bonding member DB shown in FIG. 27 is occasionally damaged. Thus, it is preferable to form the plurality of through holes DTH2 at positions overlapping the die-bonding region DBR as in the semiconductor device PKG5 and bring the rear surface CPb of the semiconductor chip CP into close contact with the encapsulation body MR in order to suppress damage to the die-bonding member DB.

When considering heat dissipation efficiency in the heat dissipation path of the heat transmitted from the semiconductor chip CP to the lead LD via the die pad DP, it is preferable that the plurality of through holes DTH2 (see FIG. 26) are not formed as in the semiconductor device PKG1 shown in FIG. 4. However, in the case where the plurality of through holes DTH2 are formed at the positions overlapping the die-bonding region DBR as shown in FIG. 26, the separation distance between the adjacent through holes DTH2 is increased, so that the heat dissipation path can be securely provided from the die-bonding region DBR to the peripheral portion of the die pad DP. In the semiconductor device PKG5, it is preferable that the area of the die pad DP in the region sandwiched between the adjacent through holes DTH2 is larger than the opening area of each of the plurality of through holes DTH2 from the viewpoint of improving heat dissipation properties.

Second Modification Example

The above has described an example in which the planar shape of the die pad DP is octagonal as shown in, for example, FIGS. 4 and 26. However, various modification examples such as a quadrangular shape may be applied to the shape of the die pad DP.

Third Modification Example

In addition, the above has described an example in which each of the plurality of through holes DTH1 and each of the plurality of metal films MF2 partially formed over the top surface DPt of the die pad DP have the same positional relation as one another as shown in, for example, FIGS. 4 and 26. However, when forming the metal film MF2 by, for example, the plating method, the position of the metal film MF2 is occasionally deviated within a range of a dimensional tolerance. Therefore, there may be configuration in which some of the plurality of metal films MF2 overlap the through hole DTH1 while some of the other metal films MF2 do not overlap the through hole DTH1.

Fourth Modification Example

Further, several modification examples described above can be combined with one another to be applied to the present invention.

Hereinafter, some of the contents of the above-described embodiments will be described by way of example.

[Additional Statement 1]

A manufacturing method of a semiconductor device comprising the steps of:

(a) preparing a lead frame that includes: a die pad having a first main surface and a second main surface opposite to the first main surface; and a plurality of leads facing the die pad in plan view and being arranged at positions so as to be spaced apart from the die pad;

(b) mounting a semiconductor chip on the die pad, the semiconductor chip including a first front surface, a first rear surface opposite to the first front surface, and a plurality of electrodes arranged on the first front surface, and the semiconductor chip being mounted on a die-bonding region on the first main surface of the die pad such that the first rear surface and the first main surface of the die pad face each other;

(c) after the step of (b), electrically connecting the plurality of electrodes of the semiconductor chip and the die pad or plurality of leads to one another via a plurality of wires; and (d) after the step of (c), encapsulating the semiconductor chip, the plurality of wires and the die pad in resin to form an encapsulation body, wherein the plurality of electrodes of the semiconductor chip include a first electrode electrically connected to a first lead among the plurality of leads via a first wire among the plurality of wires in the step of (c), and a second electrode electrically connected to the die pad via a second wire among the plurality of wires in the step of (c), the die pad includes the die-bonding region overlapping the semiconductor chip, and a wire-bonding region arranged outside the die-bonding region in plan view and to which the second wire is connected, in the step of (a), a first metal film partially covering the first main surface of the die pad is formed in the wire-bonding region, and a first through hole penetrating through the die pad from the first main surface to the second main surface is formed in the die pad at a position overlapping the first metal film or around the first metal film, in the step of (c), the second wire is bonded to the first metal film in the wire-bonding region, the encapsulation body includes a first portion formed over the first main surface of the die pad, a second portion formed under the second main surface of the die pad, and a third portion buried in the first through hole of the die pad, and in the step of (d), the first portion and the second portion of the encapsulation body are connected to each other via the third portion.

[Additional Statement 2]

The manufacturing method of a semiconductor device according to Additional Statement 1, wherein the step of (a) further includes the steps of:
(a1) forming the first through hole in the wire-bonding region on the first main surface of the die pad; and
(a2) after the step of (a1), forming the first metal film over the wire-bonding region on the first main surface of the die pad.

[Additional Statement 3]

The manufacturing method of a semiconductor device according to Additional Statement 2,
wherein the first through hole is formed at a position overlapping the first metal film in plan view, and
an inner wall of the first through hole is covered by the first metal film.

In the foregoing, the invention made by the present inventor has been concretely described based on the embodiments. However, it is needless to say that the present invention is not to be limited to the foregoing embodiments, and various modifications and alterations can be made within the scope of the present invention.

What is claimed is:

1. A semiconductor device comprising:
a die pad including a first main surface and a second main surface opposite to the first main surface;
a semiconductor chip mounted on the first main surface of the die pad, the semiconductor chip including a first front surface, a first rear surface opposite to the first front surface, and a plurality of electrodes arranged on the first front surface;
a plurality of leads including a first lead facing the die pad in plan view, the plurality of leads being arranged at positions so as to be spaced apart from the die pad, the plurality of leads being electrically connected with the semiconductor chip;
a plurality of wires including a first wire and a second wire; and
an encapsulation body encapsulating the semiconductor chip, the plurality of wires, and the die pad,
wherein the plurality of electrodes of the semiconductor chip includes 1) a first electrode electrically connected with the first lead via the first wire, and 2) a second electrode electrically connected with the die pad via the second wire,
wherein the die pad includes 1) a wire-bonding region that is A) not overlapping with the semiconductor chip in plan view and B) covered by a first metal film partially covering the first main surface of the die pad, and 2) a first through hole that penetrates through the die pad from the first main surface to the second main surface,
wherein the second wire is bonded to the first metal film in the wire-bonding region,
wherein the first through hole is formed at a position overlapping with the first metal film or around the first metal film, and
wherein an opening area of the first through hole is smaller than an area of the first metal film in plan view.

2. The semiconductor device according to claim 1,
wherein the encapsulation body includes: a first portion formed over the first main surface of the die pad, a second portion formed under the second main surface of the die pad, and a third portion buried in the first through hole of the die pad, and
wherein the first portion and the second portion of the encapsulation body are connected with each other via the third portion.

3. The semiconductor device according to claim 2,
wherein the first through hole is formed at a position overlapping the first metal film in plan view.

4. The semiconductor device according to claim 3,
wherein an entire first through hole completely overlaps the first metal film in plan view.

5. The semiconductor device according to claim 2,
wherein a plurality of the first through holes are formed in or in a periphery of the wire-bonding region, and
wherein at least one or more of the plurality of first through holes is formed at a position overlapping the first metal film in plan view.

6. The semiconductor device according to claim 5,
wherein some of the plurality of first through holes are arranged along a peripheral portion of the first metal film in plan view.

7. The semiconductor device according to claim 2,
wherein a peripheral portion of the die pad includes a first side facing the plurality of leads,
wherein the wire-bonding region includes a first wire-bonding region and a second wire-bonding region,
wherein the first wire-bonding region and the second wire-bonding region are arranged along the first side,
wherein the first metal film in the first wire-bonding region and the first metal film in the second wire-bonding region are spaced apart from each other, in plan view, without intervening any metal film therebetween, and
wherein the first through hole is formed at the position overlapping with the first metal film covering the wire-bonding region including the first wire-bonding region and the second wire-bonding region.

8. The semiconductor device according to claim 7,
wherein a width of the first metal film in the first wire-bonding region in a first direction is smaller than a separation distance between the first metal film in the first wire-bonding region and the first metal film in the second wire-bonding region in the first direction, the first direction extending along an extending direction of the first side.

9. The semiconductor device according to claim 8,
wherein each of the plurality of leads facing the first side of the die pad includes a tip portion covered by a second metal film made of the same metal material as the first metal film, and
wherein a width of the first metal film in the first wire-bonding region is larger than a width of the tip portion of each of the plurality of leads in the first direction.

10. The semiconductor device according to claim 8,
wherein a plurality of the first through holes is formed in the first wire-bonding region, and
wherein an opening area of each of the plurality of first through holes in the first wire-bonding region is smaller than a planar area of the first metal film.

11. The semiconductor device according to claim 10,
wherein each of the plurality of leads facing the first side of the die pad includes a tip portion covered by a second metal film made of the same metal material as the first metal film, and
wherein an opening width of each of the plurality of first through holes is larger than a width of the tip portion of each of the plurality of leads in the first direction.

12. The semiconductor device according to claim 2,
wherein a plurality of the first through holes is formed in the wire-bonding region, and
wherein an opening area of each of the plurality of first through holes is smaller than a planar area of the first metal film.

13. The semiconductor device according to claim 12,
wherein the die pad comprises a plurality of second through holes overlapping a die-bonding region overlapping the semiconductor chip in plan view and penetrating through the die pad from the first main surface to the second main surface,
wherein a portion of the first rear surface of the semiconductor chip is adhered to the encapsulation body, and
wherein an opening area of each of the plurality of first through holes is smaller than an opening area of each of the plurality of second through holes.

14. The semiconductor device according to claim 2, wherein an inner wall of the first through hole is covered by the first metal film.

15. The semiconductor device according to claim 2, wherein an adhesive strength between the first metal film and the encapsulation body is lower than an adhesive strength between a substrate of the die pad and the encapsulation body.

16. The semiconductor device according to claim 2,
wherein a plurality of suspension leads extending from a peripheral portion of the die pad to a peripheral portion of the encapsulation body is connected with the die pad,
wherein the wire-bonding region exists at a plurality of regions of the die pad,
wherein the plurality of regions is spaced apart from each other, and
wherein the plurality of regions includes:
   a first wire-bonding region formed over an extended line of any of the plurality of suspension leads, and
   a second wire-bonding region formed at a position that differs from the extended line of any of the plurality of suspension leads.

17. The semiconductor device according to claim 2,
wherein the encapsulation body includes resin and a plurality of filler particles that are mixed in the resin, and
wherein an opening width of the first through hole is larger than a particle size of each of the plurality of filler particles.

18. A semiconductor device comprising:
a die pad including 1) a first side extending in a first direction, 2) a first main surface, and 3) a second main surface opposite to the first main surface;
a semiconductor chip mounted on the first main surface of the die pad, the semiconductor chip including 1) a first front surface, 2) a first rear surface opposite to the first front surface, and 3) a plurality of electrodes arranged on the first front surface;
a plurality of leads including a first lead facing the die pad in plan view, arranged at positions so as to be spaced apart from the die pad, and electrically connected with the semiconductor chip;
a plurality of wires including a first wire and a second wire; and
an encapsulation body encapsulating the semiconductor chip, the plurality of wires and the die pad,
wherein the plurality of electrodes of the semiconductor chip includes a first electrode electrically connected with the first lead via a first wire, and a second electrode electrically connected with the die pad via a second wire,
wherein the die pad includes a wire-bonding region that is not overlapping the semiconductor chip in plan view, and that is covered by a first metal film partially covering the first main surface of the die pad, a first through hole and penetrating through the die pad from the first main surface to the second main surface, and a second through hole penetrating through the die pad from the first main surface to the second main surface,
wherein the second wire is bonded to the first metal film in the wire-bonding region which is surrounded with the first through hole, the second through hole and the first side of the die pad,
wherein each of the first and second through holes is formed at a position overlapping with the first metal film or around the first metal film, and
wherein an opening area of each of the first and second through holes is smaller than an area of the first metal film in plan view.

19. The semiconductor device according to claim 18,
wherein, in plan view, the first and second through holes are formed between the first side of the die pad and the semiconductor chip, and
wherein the first and second through holes are arranged along the first side extending in the first direction.

20. The semiconductor device according to claim 19, wherein the first and second through holes are closer to the first side of the die pad than the semiconductor chip is to the first side of the die pad, in plan view.

* * * * *